United States Patent
Ozawa

(10) Patent No.: US 6,819,609 B2
(45) Date of Patent: Nov. 16, 2004

(54) SEMICONDUCTOR MEMORY DEVICE WITH BUILT-IN SELF-DIAGNOSTIC FUNCTION AND SEMICONDUCTOR DEVICE HAVING THE SEMICONDUCTOR MEMORY DEVICE

(75) Inventor: Tadashi Ozawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 109 days.

(21) Appl. No.: 10/370,487

(22) Filed: Feb. 24, 2003

(65) Prior Publication Data

US 2003/0235094 A1 Dec. 25, 2003

(30) Foreign Application Priority Data

Jun. 25, 2002 (JP) ........................................ 2002-184305

(51) Int. Cl.[7] ................................................ G11C 7/00
(52) U.S. Cl. .................................. 365/201; 365/189.01
(58) Field of Search ............................ 365/201, 189.01, 365/230.01; 714/30

(56) References Cited

U.S. PATENT DOCUMENTS 5,953,273 A * 9/1999 Ikegami ...................... 365/201
6,459,638 B1 * 10/2002 Wu et al. ..................... 365/201
6,529,430 B2 * 3/2003 Wu et al. ..................... 365/201

FOREIGN PATENT DOCUMENTS

| JP | 9-015301 | 1/1997 |
| JP | 2001-148199 | 5/2001 |

* cited by examiner

Primary Examiner—Anh Phung
(74) Attorney, Agent, or Firm—Arent Fox, PLLC.

(57) ABSTRACT

A semiconductor memory device having a self-diagnostic test function which enables flexible adjustment to change and addition of test specifications without having to perform complicated control with a complicated and large-scale circuit structure is provided. As memory operation specification information, capacity information R1, bus width information R2, and burst length information R3 are inputted from the outside and stored in a capacity information storing circuit 1, a bus-width-information storing circuit 2, and a burst-length-information storing circuit 3. The stored information R1 to R3 is inputted to a max./min. value generator circuit 11, and a maximum address AMAX1 and a minimum address AMIN1 are generated at the max./min. value generator circuit 11. Since the memory operation specification information such as the information R1 to R3 is rewritten from the outside, the maximum address AMAX1 and the minimum address AMIN1 in an address space can be set in accordance with the specifications.

27 Claims, 16 Drawing Sheets

CIRCUIT BLOCK DIAGRAM OF FIRST EMBODIMENT

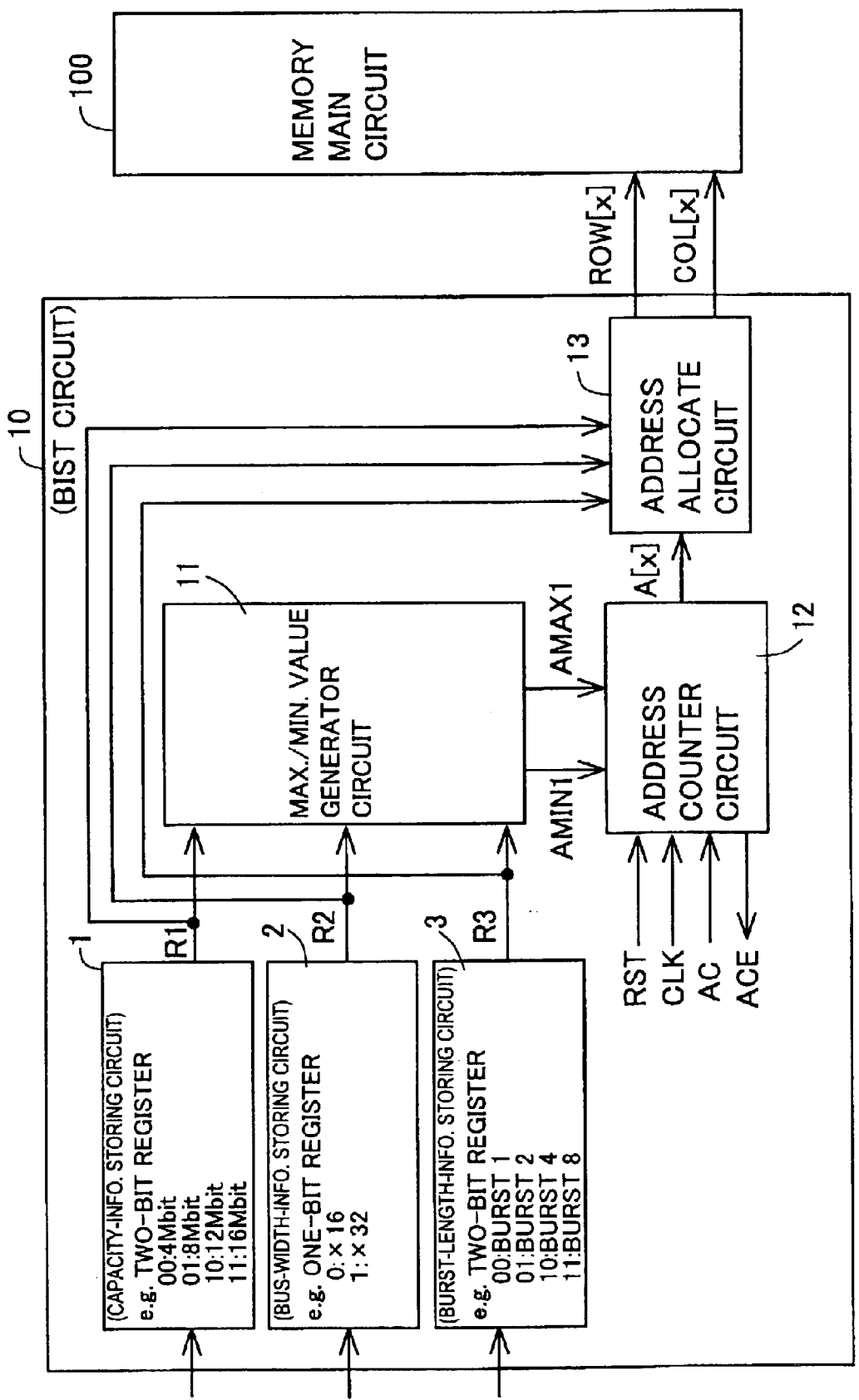
FIG. 1 CIRCUIT BLOCK DIAGRAM OF FIRST EMBODIMENT

FIG. 2  SETTING TABLE FOR MAX./MIN. VALUE GENERATOR CIRCUIT

| MAX./MIN. VALUE GENERATOR CIRCUIT | | (COMBINATIONAL CIRCUIT NOT CAUSING CLK OPERATION BUT KEEPING OUTPUTTING) | | | |
|---|---|---|---|---|---|
| CAPACITY | BUS WIDTH | \multicolumn{4}{c|}{BURST LENGTH} |
| | | 1 | 2 | 4 | 8 |
| 4M | ×16 | MAX.:0011111111111111<br>MIN.:0000111111111111 | MAX.:0001111111111111<br>MIN.:0000000000000000 | MAX.:0000111111111111<br>MIN.:0000000000000000 | MAX.:0000011111111111<br>MIN.:0000000000000000 |
| 4M | ×32 | MAX.:0001111111111111<br>MIN.:0000000000000000 | MAX.:0000111111111111<br>MIN.:0000000000000000 | MAX.:0000011111111111<br>MIN.:0000000000000000 | MAX.:0000001111111111<br>MIN.:0000000000000000 |
| 8M | ×16 | MAX.:0111111111111111<br>MIN.:0000000000000000 | MAX.:0011111111111111<br>MIN.:0000000000000000 | MAX.:0001111111111111<br>MIN.:0000000000000000 | MAX.:0000111111111111<br>MIN.:0000000000000000 |
| 8M | ×32 | MAX.:0011111111111111<br>MIN.:0000000000000000 | MAX.:0001111111111111<br>MIN.:0000000000000000 | MAX.:0000111111111111<br>MIN.:0000000000000000 | MAX.:0000011111111111<br>MIN.:0000000000000000 |
| 12M | ×16 | MAX.:1011111111111111<br>MIN.:0000000000000000 | MAX.:0101111111111111<br>MIN.:0000000000000000 | MAX.:0010111111111111<br>MIN.:0000000000000000 | MAX.:0001011111111111<br>MIN.:0000000000000000 |
| 12M | ×32 | MAX.:0101111111111111<br>MIN.:0000000000000000 | MAX.:0010111111111111<br>MIN.:0000000000000000 | MAX.:0001011111111111<br>MIN.:0000000000000000 | MAX.:0000101111111111<br>MIN.:0000000000000000 |
| 16M | ×16 | MAX.:1111111111111111<br>MIN.:0000000000000000 | MAX.:0111111111111111<br>MIN.:0000000000000000 | MAX.:0011111111111111<br>MIN.:0000000000000000 | MAX.:0001111111111111<br>MIN.:0000000000000000 |
| 16M | ×32 | MAX.:0111111111111111<br>MIN.:0000000000000000 | MAX.:0011111111111111<br>MIN.:0000000000000000 | MAX.:0001111111111111<br>MIN.:0000000000000000 | MAX.:0000111111111111<br>MIN.:0000000000000000 |

OPERATION FLOW OF ADDRESS COUNTER CIRCUIT

FIG. 4 ADDRESS ALLOCATION CHART OF ADDRESS ALLOCATE CIRCUIT

ROW[x]  ROW ADDRESS GIVEN TO MEMORY
COL[x]  COLUMN ADDRESS GIVEN TO MEMORY
A[x]    ADDRESS OUTPUTTED FROM ADDRESS COUNTER CIRCUIT
D/C     Don't care

| BUS WIDTH | BURST LENGTH | ROW[14] SELECT BANK | ROW[13] | ROW[12] | ROW[11] SELECT FOR BURST | ROW[10] | ROW[9] | ROW[8] | ROW[7] | ROW[6] | ROW[5] SELECT WORD LINE | ROW[4] | ROW[3] | ROW[2] | ROW[1] | ROW[0] |
|---|---|---|---|---|---|---|---|---|---|---|---|---|---|---|---|---|
| x32 | 1 | A[18] | A[17] | A[16] | A[15] | A[14] | A[13] | A[8] | A[7] | A[6] | A[5] | A[4] | A[3] | A[2] | A[1] | A[0] |
|  | 2 | A[17] | A[16] | A[15] | A[14] | D/C | A[13] | A[8] | A[7] | A[6] | A[5] | A[4] | A[3] | A[2] | A[1] | A[0] |
|  | 4 | A[16] | A[15] | A[14] | D/C | D/C | A[13] | A[8] | A[7] | A[6] | A[5] | A[4] | A[3] | A[2] | A[1] | A[0] |
|  | 8 | A[15] | A[14] | D/C | D/C | D/C | A[13] | A[8] | A[7] | A[6] | A[5] | A[4] | A[3] | A[2] | A[1] | A[0] |
| x16 | 1 | A[19] | A[18] | A[17] | A[16] | A[15] | A[14] | A[8] | A[7] | A[6] | A[5] | A[4] | A[3] | A[2] | A[1] | A[0] |
|  | 2 | A[18] | A[17] | A[16] | A[15] | D/C | A[14] | A[8] | A[7] | A[6] | A[5] | A[4] | A[3] | A[2] | A[1] | A[0] |
|  | 4 | A[17] | A[16] | A[15] | D/C | D/C | A[14] | A[8] | A[7] | A[6] | A[5] | A[4] | A[3] | A[2] | A[1] | A[0] |
|  | 8 | A[16] | A[15] | D/C | D/C | D/C | A[14] | A[8] | A[7] | A[6] | A[5] | A[4] | A[3] | A[2] | A[1] | A[0] |

| BUS WIDTH | COL[14] | COL[13] | COL[12] | COL[11] | COL[10] | COL[9] | COL[8] | COL[7] | COL[6] | COL[5] NARROW DOWN BUSES | COL[4] | COL[3] | COL[2] | COL[1] | COL[0] |
|---|---|---|---|---|---|---|---|---|---|---|---|---|---|---|---|
| x32 | D/C | D/C | D/C | D/C | D/C | D/C | A[12] | A[11] | A[10] | A[9] | D/C | D/C | D/C | D/C | D/C |
| x16 | D/C | D/C | D/C | D/C | D/C | D/C | A[13] | A[12] | A[11] | A[10] | A[9] | D/C | D/C | D/C | D/C |

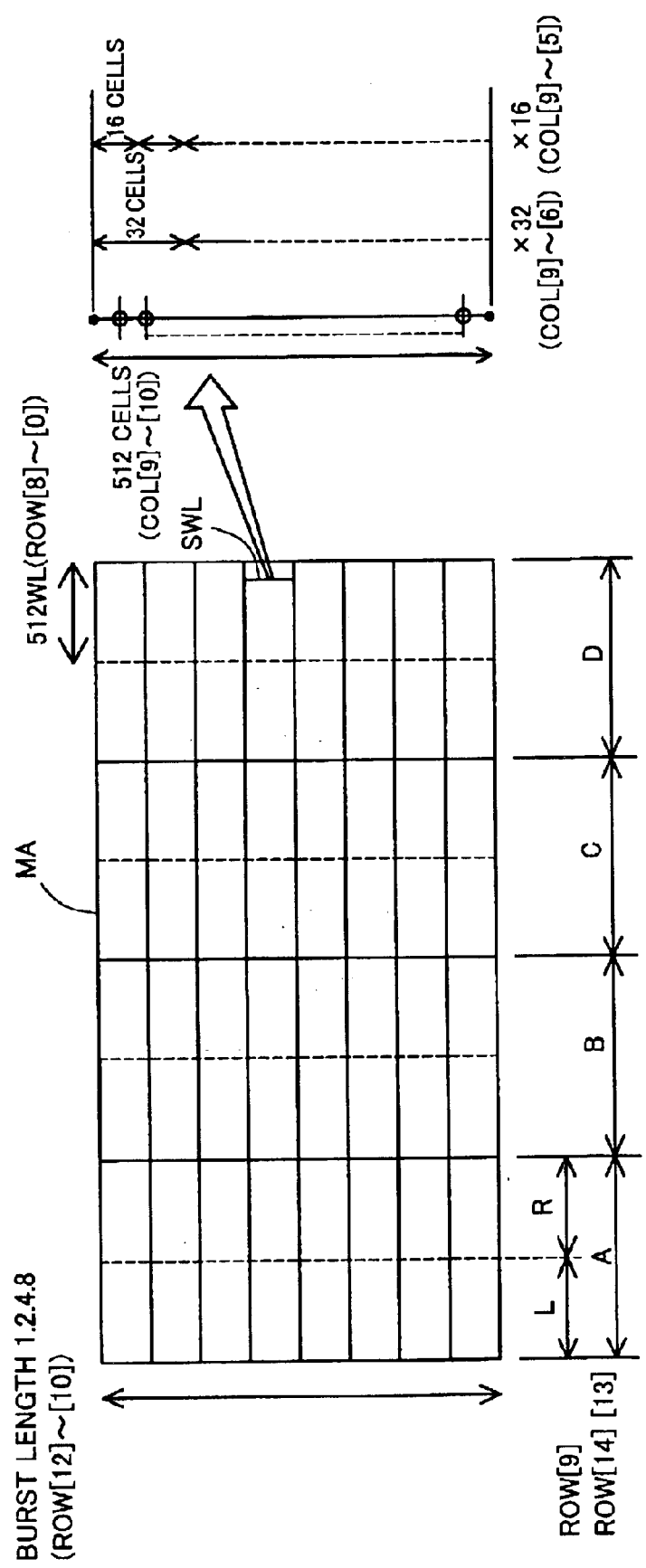
FIG. 5  CHART SHOWING ADDRESS ALLOCATION OF MEMORY-CELL ARRAY REGION

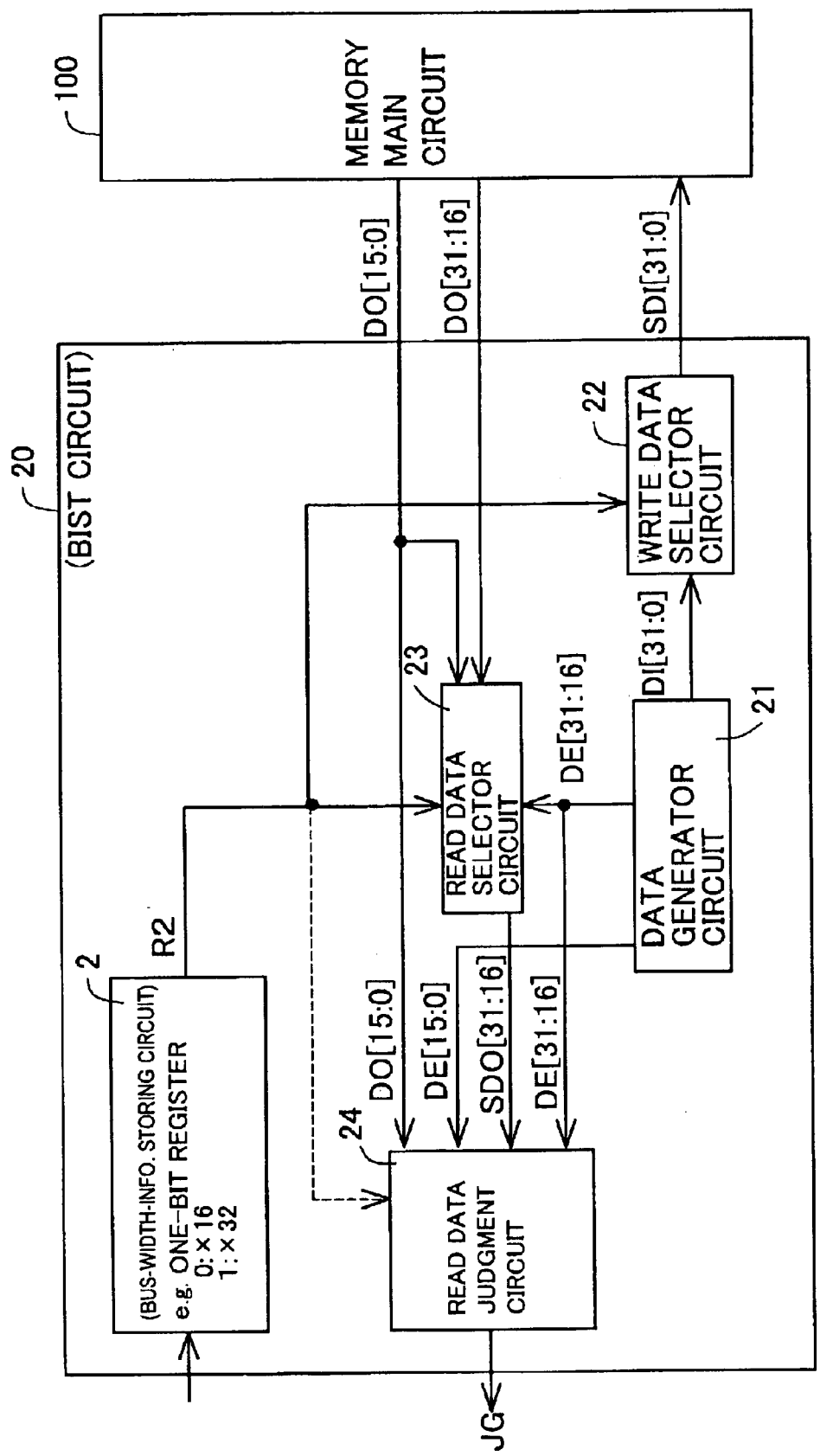
FIG. 6 CIRCUIT BLOCK DIAGRAM OF SECOND EMBODIMENT

FIG. 7

TRUTH TABLE OF WRITE DATA SELECTOR CIRCUIT

| BUS WIDTH | SELECTED DATA |
|---|---|
| X16 | 0000000000000000+DI[15:0] |
| X32 | DI[31:0] |

(FOR AVOIDING ERRONEOUS OPERATION DUE TO UNSETTLED VALUE, NON-SELECTED WRITE VALUE IS SET TO 0 WHEN BUS WIDTH IS X16(NOT WRITTEN IN MEMORY CELL))

FIG. 8

TRUTH TABLE OF READ DATA SELECTOR CIRCUIT

| BUS WIDTH | SELECTED DATA |
|---|---|
| X16 | DE[31:16] |
| X32 | DO[31:16] |

FIG. 9 CIRCUIT BLOCK DIAGRAM OF THIRD EMBODIMENT

FIG. 10  CIRCUIT BLOCK DIAGRAM OF FOURTH EMBODIMENT (MAIN PART)

FIG. 11 CIRCUIT BLOCK DIAGRAM OF FIFTH EMBODIMENT

FIG. 12 CIRCUIT BLOCK DIAGRAM OF SIXTH EMBODIMENT

FIG. 13 CIRCUIT BLOCK DIAGRAM OF SEVENTH EMBODIMENT

MAIN PART CIRCUIT BLOCK DIAGRAM OF NINTH EMBODIMENT

CONVENTIONAL PROBLEM(1) :IN CASE BIST CIRCUIT IS BUILT IN

CONVENTIONAL PROBLEM(2) :IN CASE BIST CIRCUIT IS BUILT IN

SEMICONDUCTOR MEMORY DEVICE INTERNALLY PROVIDED WITH BIST CIRCUIT DIRECTED TO PRIOR ART

SEMICONDUCTOR MEMORY DEVICE WITH BUILT-IN SELF-DIAGNOSTIC FUNCTION AND SEMICONDUCTOR DEVICE HAVING THE SEMICONDUCTOR MEMORY DEVICE

BACKGROUND OF THE INVENTION

1. Field of the Invention

This invention relates to a semiconductor memory device with a built-in self-diagnostic function and a semiconductor device having this semiconductor memory device. Particularly, this invention relates to a semiconductor memory device having a self-diagnostic test function which enables flexible adjustment to a change of test specification.

2. Description of the Related Art

To test a recent large-capacity high-speed semiconductor memory device, a tester needs to operate at a high speed. Particularly a tester necessary for testing a high-speed synchronous semiconductor memory device is required to operate at a very high speed and the tester itself is expensive. Moreover, depending on increase in operation frequency of the semiconductor memory device, the tester cannot follow the increased operation frequency.

As systems have become more and more advanced and complicated, a built-in semiconductor memory device with a large capacity is provided as a memory module in a high-performance semiconductor device called system LSI. In some cases, for such a semiconductor memory device as a built-in module, a terminal group for inputting/outputting addresses, data, commands and the like is not provided as a terminal group of the semiconductor device and testing of the semiconductor memory device cannot be carried out from the outside.

Thus, if a built-in self-test (hereinafter referred to as BIST) circuit for carrying out self-diagnosis of the memory is provided in the semiconductor memory device or in the semiconductor device having the semiconductor memory device as a memory module, testing can be carried out without using an expensive tester for the large-capacity high-speed semiconductor memory device and irrespective of the presence/absence of a test terminal for the memory module built-in the semiconductor device.

As an example of the semiconductor memory device having such a BIST circuit, a semiconductor memory device is described in the JP Laid-Open Patent Publication No.2001-148199, in which a program for carrying out self-test loaded in advance in a command RAM 50 is sequentially read out in accordance with a program counter value outputted from an ALPG 54, thus testing a memory-cell array 30, and the test result is outputted via an input/output and BIST write/judgment circuit 32, as shown in FIG. 18. The loading of the program to the command RAM 50 is carried out as a BIST controller 62 functions as a load sequencer for the program. It is a semiconductor memory device in which testing is carried out while changing data and command patterns by loading the program for test to the command RAM 50 from the outside.

However, in the case where testing by a BIST circuit built in a semiconductor memory device or a memory module of a semiconductor device constituted on the basis of memory specifications established at the time of design, if the number of types of write data patterns to each memory cell by BIST increases, the circuit scale of the BIST circuit expands and the proportion of the BIST circuit region to a memory main circuit region which functions as a semiconductor memory device, on a chip die, increases, as shown in FIG. 16. Therefore, increase in overhead due to the occupied area of the BIST circuit on the chip causes a problem of increase in chip size and chip cost.

In the case where a built-in semiconductor memory device is provided as a memory module in a semiconductor device, generally, the required memory capacity differs depending on the specifications of a system in which the semiconductor device is used. Thus, in expanding types of semiconductor device, in order to reduce the time and cost for development and manufacture, a memory module is designed in accordance with a maximum memory capacity required for the type expansion and only module structures such as memory capacity, address length, bus width, burst length that are necessary for individual types are used.

In this case, however, the test specifications of the BIST circuit need be adjusted to each of the actually used memory modules. Memory modules having a maximum permissible memory capacity must be provided and the BIST circuit must be redesigned for each type despite the reduction in time and cost for redevelopment and remanufacture of the memory modules, which is a problem. For example, as shown in FIG. 17, if two megabits are used for an eight-megabit memory module as a memory main circuit, a BIST circuit for two megabits (FIG. 17, (A)) is necessary. A BIST circuit for four megabits (FIG. 17, (B)) is necessary in the case of four megabits, and a BIST circuit for eight megabits (FIG. 17, (C)) is necessary in the case of eight megabits. Moreover, with respect to the bus width, a BIST circuit for ×8 bits (FIG. 17, (D)) is necessary in the case of ×8 bits. A BIST circuit for ×16 bits (FIG. 17, (E)) is necessary in the case of ×16 bits, and a BIST circuit for ×32 bits (FIG. 17, (F)) is necessary in the case of ×32 bits.

Once the BIST circuit is installed, its operation specifications cannot be changed, causing a problem that change and addition of write data patterns and change of the test specifications cannot be carried out.

The change of the test specifications in the BIST circuit is possible by using a semiconductor memory device described in the JP Laid-Open Patent Publication No.2001-148199. However, in the semiconductor memory device of the JP Laid-Open Patent Publication No.2001-148199, the command RAM 50 made of an SRAM, the ALPG 54 and the like must be provided for storage of programs, operation control and the like. Therefore, the BIST circuit needs complicated control. There arise problems such as a longer development period due to the complicated circuit structure and increase in overhead on the chip die due to the need for a large occupied area on the chip.

SUMMARY OF THE INVENTION

In order to solve at least one of the problems of the above-described conventional techniques, it is an object of the present invention to provide a semiconductor memory device having a self-diagnostic test function which enables flexible adjustment to change and addition of test specifications without having a complicated and large-scale circuit structure to perform complicated control in self-diagnostic test, or to provide a semiconductor device having the semiconductor memory device as a memory macro.

In order to achieve the above-described object, a semiconductor memory device or a semiconductor device having a semiconductor memory device as a memory macro according to one aspect of the present invention includes a semiconductor memory device having a self-diagnostic test function, the semiconductor memory device comprising a memory operation specification information storing unit in which memory operation specification information that is rewritable from the outside is stored, wherein an operation parameter in self-diagnostic test is set on the basis of the memory operation specification information.

A semiconductor memory device or a semiconductor device having a semiconductor memory device as a memory macro according to another aspect of the present invention includes a semiconductor memory device having a self-diagnostic test function, the semiconductor memory device comprising a test specification information storing unit in which test specification information that is rewritable from the outside is stored, wherein operation specification in self-diagnostic test is set on the basis of the test specification information.

In the semiconductor memory device or the semiconductor device having a semiconductor memory device as a memory macro according to one aspect or another aspect of the present invention, a memory operation specification information storing unit in which memory operation information that is rewritable from the outside is stored, or a test specification information storing unit in which test specification information that is rewritable from the outside is stored, is provided and an operation parameter or operation specification in self-diagnostic test is set on the basis of each information stored in each storing unit.

Thus, since the memory operation specification information can be properly rewritten from the outside the semiconductor memory device, the memory operation specification information can be rewritten in accordance with each type in expanding the types of the semiconductor memory device and the self-diagnostic test function need not be redesigned for each type.

Moreover, since the test specification information can be properly rewritten from the outside the semiconductor memory device, even when the number of test items is increased, the test specification information can be rewritten for each test and the increased number of test items can be dealt with by using a compact self-diagnostic test structure. Also in the case of change or addition of the test specifications, the test specification information can be rewritten in accordance with the test specifications and the self-diagnostic test function need not be redesigned.

Furthermore, as the memory operation specification information or the test specification information is rewritten when necessary, variation elements such as increase in the number of test items, change and addition of the test specifications, and type expansion can be dealt with by one type of self-diagnostic test structure. Therefore, complicated control such as loading a program for each variation element is no longer necessary.

In a test circuit which realizes the self-diagnostic test function, the circuit scale of the test circuit is not increased by the increase in number of test items, and redesign of the test circuit due to change or addition of the test specifications or corresponding to each type of semiconductor memory device is not necessary. Moreover, a complicated large-scale circuit structure to deal with all the variation elements such as increase in the number of test items, change and addition of the test specifications, and type expansion, is not necessary, either. The period for development and design of the self-diagnostic test circuit can be shortened. At the same time, the occupied area of the test circuit in the semiconductor memory device can be reduced to a small area and increase in chip size and chip cost can be restrained.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 1 is a circuit block diagram of a first embodiment;

FIG. 2 is a setting table for max./min. value generator circuit;

FIG. 4 is an address allocation chart of address allocate circuit;

FIG. 5 is a conceptual chart showing address allocation of memory-cell array region;

FIG. 6 is a circuit block diagram of a second embodiment;

FIG. 7 shows a truth table of a write data selector circuit;

FIG. 8 shows a truth table of read data selector circuit;

FIG. 16 is a conceptual diagram showing a conventional problem (1), namely, in case BIST circuit is built in;

FIG. 17 is a conceptual diagram showing other conventional problem (2), namely, in case BIST circuit is built in.

DESCRIPTION OF THE PREFERRED EMBODIMENTS

Figure 3:
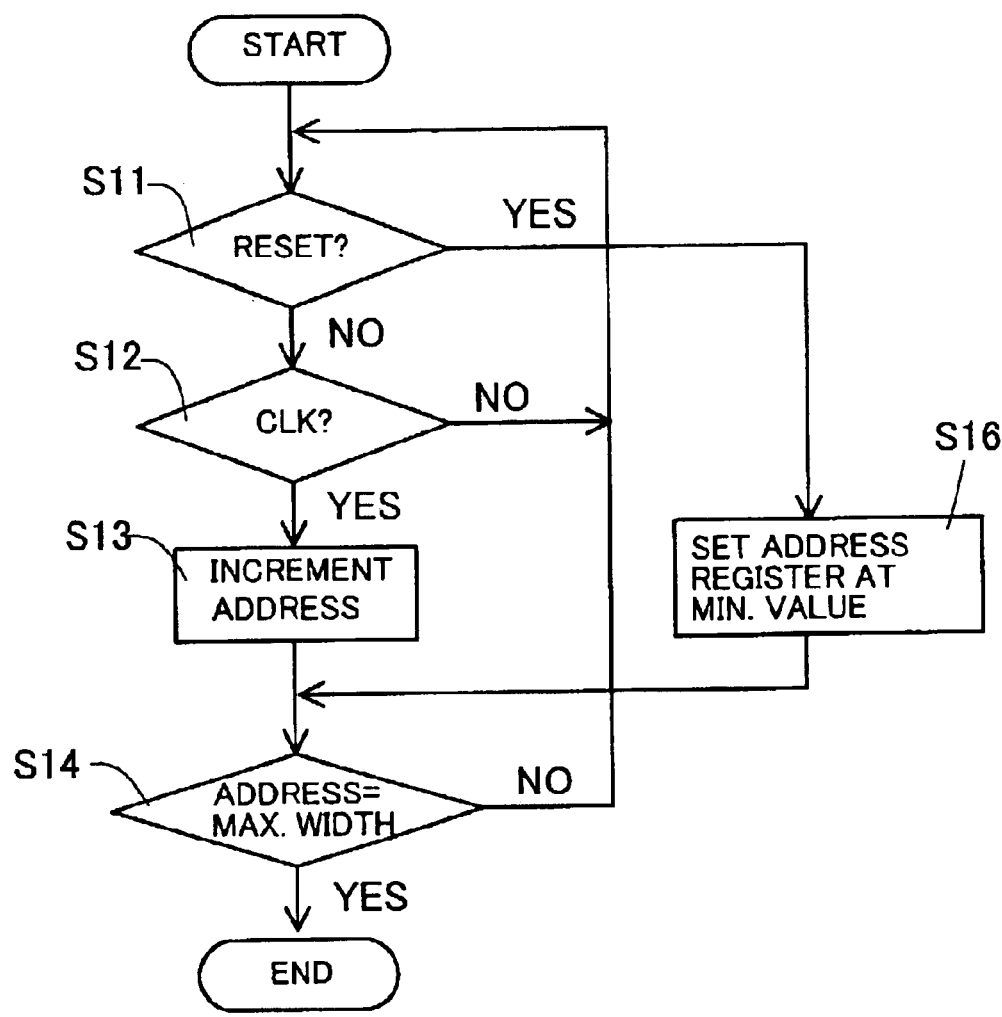
FIG. 3 is a flowchart showing operation flow of address counter circuit.

Hereinafter, embodiments of the semiconductor memory device of the present invention will be described in detail with reference to FIGS. 1 to 15.

A first embodiment shown in FIG. 1 is an exemplary structure of a BIST circuit 10 having a function to adjust a maximum address AMAX1 and a minimum address AMIN1 in an address space in BIST, in accordance with memory operation specification information inputted from the outside.

In the first embodiment, prior to BIST, two-bit structured capacity information R1, one-bit structured bus width information R2, and two-bit structured burst length information R3 are inputted from the outside as memory operation specification information. Specification information designated by the two-bit capacity information R1 is, for example, a four-megabit capacity (R1="00"), eight-megabit capacity (R1="01"), a 12-megabit capacity (R1="10"), or a 16-megabit capacity (R1="11"). Specification information designated by the one-bit bus width information R2 is, for example, a bus width of ×16 (R2="0") or a bus width of ×32 (R2="1"). Specification information designated by the two-bit burst length information R3 is, for example, a burst length of 1 (R3="00"), a burst length of 2 (R3="01"), a burst length of 4 (R3="10"), or a burst length of 8 (R3="11"). The inputted information R1 to R3 is stored into a capacity information storing circuit 1, which is a two-bit register, a bus-width-information storing circuit 2, which is a one-bit register, and a burst-length-information storing circuit 3, which is a two-bit register, respectively.

The capacity information R1, the bus width information R2 and the burst length information R3 stored in the respective registers 1 to 3 are inputted to a max./min. value generator circuit 11, and the maximum address AMAX1 and the minimum address AMIN1 corresponding to the information R1 to R3 are generated at the max./min. value generator circuit 11.

As a BIST operation starts, an address counter circuit 12 starts an address count operation. In the case of a circuit setting such that the address counter circuit 12 carries out a count-up operation, after the minimum address AMIN1 inputted from the max./min. value generator circuit 11 is set as an initial count value by a reset signal RST inputted thereto, the count-up operation is sequentially carried out synchronously with a clock signal CLK inputted in accordance with input of an address count signal AC. When the count value coincides with the maximum address AMAX1 inputted from the max./min. value generator circuit 11, an address count end signal ACE is outputted to end the count operation.

An address A[x] counted by the address counter circuit 12 is inputted to an address allocater circuit 13, where the address is allocated as a row address ROW[x] and a column address COL[x]. In the allocation at this point, the addresses ROW [x] and COL [x] accessed in accordance with the information R1 to R3 are set on the basis of the structure of a memory-cell array region in a memory main circuit 100.

FIG. 2 shows an example of a setting table of the maximum address AMAX1 and the minimum address AMIN1 corresponding to the capacity information R1, the bus width information R2 and the burst length information R3 in the max./min. value generator circuit 11. In this setting table, the minimum address AMIN1 is set at "0". Address spaces of the memory-cell array differ depending on the capacity information R1, the bus width information R2 and the burst length information R3. If the minimum address AMIN1 is set at "0", the maximum address AMAX1 need be increased or decreased.

Judging from the setting ranges of the information R1 to R3 shown in FIG. 1 as an example (R1 has a value within a range of 4 to 16 megabits as specification information of capacity value, R2 has a value of ×16 or ×32 bus as specification information of bus width, and R3 represents a burst length of 1 to 8 as specification information of burst length), the largest number of address spaces are necessary when the capacity is 16 megabits, the bus width is ×16 and the burst length is 1. Specifically, while the capacity of 16 megabits, that is $2^{24}$, requires address spaces for 24 bits, as input/output is carried out with the bus width of ×16, $2^4$, that is, address spaces for four bits need not be identified (i.e., "Don't care"). Therefore, address spaces for 20 bits (24−4= 20) are necessary. In this case, as the maximum address AMAX1, all the 20 bits are "1" (AMAX1=$2^{19}+2^{18}+ \ldots +2^0$).

Therefore, after 20 bits are secured as the maximum address spaces, with respect to other setting conditions based on the information R1 to R3, the maximum address AMAX1 can be set by not counting some bit positions out of the high-ordered bits of the maximum address AMAX1 in accordance with the setting conditions.

For example, in the setting of the bus width information R2, the bust width doubles from ×16 to ×32, and in the setting of the burst length information R3, the burst length increase from 1 to 2, 4, 8, by exponential multiplication of 2. The number of bits accessed by one access operation increases by exponential multiplication of 2. That is, the number of address spaces decreases by 1/(exponential multiplication of 2). The number of bits may be made unnecessary to identify (i.e., "Don't care"), by exponential multiplication of 2 from the most significant bit of the maximum address AMAX1. Similarly, this also applies to the case where the capacity value is reduced from 16 megabits to eight megabits, from eight megabits to four megabits, or from 16 megabits to four megabits, by 1/(exponential multiplication of 2) in accordance with the setting of the capacity information R1.

When the capacity value is reduced from 16 megabits to 12 megabits in accordance with the setting of the capacity information R1, the amount of decrease in capacity value is four megabits, which is a decrease in capacity value for 22 bits. Since address spaces for four bits need not be identified (i.e., "Don't care") when input/output is carried out with a bus width of ×16, address spaces for 18 bits (22−4=18) need not be identified (i.e., "Don't care"). Therefore, as shown in the maximum address AMAX1 for the capacity of 12 megabits, the bus width of ×16 and the burst length of 1, "0" may be set at the 18$^{th}$ bit position in order to make the count values unnecessary to identify (i.e., "Don't care") at the 0$^{th}$ to 17$^{th}$ bit positions.

Although a specific exemplary circuit of the max./min. value generator circuit 11 is not shown in FIG. 2, the setting table in FIG. 2 shows that the bit information of the maximum address AMAX1 and the minimum address AMIN1 is univocally defined with respect to the information stored in the registers 1 to 3 as the capacity information R1, the bus width information R2 and the burst length information R3. Therefore, as a matter of course, the maximum address AMAX1 and the minimum address AMIN1 are obtained as outputs of a combinational logic circuit using the information R1 to R3 as inputs.

FIG. 3 shows an operation flow of address count at the address counter circuit 12. When a count operation is designated by an address count signal AC, the operation flow of FIG. 3 starts. First, at step (hereinafter briefly referred to as S) 11, the presence/absence of a reset signal RST is judged. If a reset signal RST is inputted (YES at S11), the minimum address AMIN1 is set in an address register in the address counter circuit 12 (S16), and whether the address count value set in the address register is the maximum address AMAX1 or not is judged (S14). In this case, since it is judged that the address count value is not the maximum address AMAX1 (NO at S14), the operation returns to the judgment on the presence/absence of a reset signal RST of S11.

Generally, a reset signal RST become inactive after the minimum address AMIN1 is set in the address register. Therefore, the subsequent operation is carried out on assumption that it is judged at S11 that a reset signal RST is not inputted (NO at S11). Next, at S12, the presence/absence of a clock signal CLK is judged. If a leading edge or a trailing edge of state transition of a clock signal CLK is detected (YES at S12), a count-up operation is carried out and the value of the address register is incremented by one (S13). Whether the incremented value of the address register is coincident with the maximum address AMAX1 or not is judged (S14). If it is not coincident (NO at S14), the operation returns to S11 to repeat the count-up operation. If it is coincident (YSE at S14), the address count-up operation ends.

Although not shown in the operation flow of FIG. 3, the address register has a length corresponding to a 20-bit width and its content is outputted as a address A [x] to an address allocater circuit 13 on the next stage.

In FIG. 3, though a specific exemplary circuit of the address counter circuit 12 is not shown, it is a matter of course that the address counter circuit 12 can be constituted by a typical synchronous-type binary counter in which an initial value is set by a reset signal RST and which carries out a binary count operation synchronously with a clock signal CLK.

FIG. 4 shows an address allocation chart in the address allocater circuit 13. The address A [x] outputted from address counter circuit 12 has a binary count value with a 20-bit width. Thus, the address A[x] must be allocated as a row address ROW [x] and a column address COL [x], corresponding to the address structure of an actual memory-cell array region MA (see FIG. 5). FIG. 4 shows the case where address allocation is switched in accordance with the bus width of ×16 or ×32 set by the bus width information R2 and the burst length 1, 2, 4 or 8 set by the burst length information R3. The address structure of a memory-cell array region MA realized in this allocation chart is shown in FIG. 5. As for the capacity information R1, a capacity value of 16 megabits is set.

Referring to FIGS. 4 and 5, specific address allocation will be described. First, the row addresses ROW [x] will be described. Row addresses ROW [14], [13] of low-ordered two bits from the most significant bit are set as the most significant row addresses (or bank addresses) indicating quadrisected banks A to D. Two bits from the most significant bit of the address A[x] are allocated thereto. However, with respect to the most significant bit of the address A[x], the bit position in the address A [x] changes in accordance with changes of the address spaces as shown in the maximum address AMAX1 of FIG. 2, corresponding to the bus width information R2 and the burst length information R3.

Row addresses ROW [12] to [10] of low-ordered three bits are row addresses for a burst operation. The burst operation is an operation mode for continuously carrying out data access while sequentially changing the reading position in the direction of column between word lines accessed at the same time as a parallel operation. In a structure such that eight-divided sub-word lines SWL are provided for a main word line MWL running through the banks A to D in the longitudinal direction and selection of each sub-word line SWL is carried out on the basis of the row addresses ROW [12] to [10], the burst operation can be performed. That is, for the burst length of 1, one sub-word line SWL is selected by identification based on all of the row address ROW [12] to [10]. For the burst lengths of 2, 4 and 8, two, four and eight sub-word lines SWL are selected by making the row address ROW [10], the row addresses [11] and [10], and the row addresses ROW [12] to [10], unnecessary to identify (i.e., "Don't care"), respectively. Thus, the operation with a predetermined burst length can be realized.

A row address [9] is for selecting one region to be an active region in the case where the banks A to D are bisected into L regions and R regions. For example, in a shared sense amplifier system, this applies to selection as to which region of L/R is to be differentially amplified by a sense amplifier.

Nine bits of row addresses [8] to [0] are for selection of a word line group in each of L/R regions in the banks A to D. In this region, 512 word lines ($2^9$=512) are arranged. With the foregoing address structure, one main word line MWL is selected in accordance with the row addresses ROW [14] to [0] and the number of sub-word lines SWL to be connected to the selected main word line MWL is selected in accordance with the setting of the burst length. In accordance with the burst length of 1, 2, 4 and 8, the number of selected sub-word lines SWL is one, two, four and eight. The total number of sub-word lines SWL identified by the row addresses ROW [14] to [0] is $2^{15}$.

The row addresses ROW [14] and [13] for selecting a bank and the row address [9] for selecting an active region in a bank are addresses related to selection of an active region in the memory-cell array region MA. Moreover, the row addresses ROW [12] to [10] for setting a burst operation are addresses related to switching of the number of sub-word lines SWL to be activated. Since all of these are addresses that should be fixedly set in advance, the addresses from the most significant bit of the address A [x] are allocated.

On the other hand, selection of each main word line MWL is directly related with an access operation to memory cells and must be sequentially switched. Therefore, the addresses A [8] to [0] of nine bits from the least significant bit of the address A [x] are allocated.

The column addresses COL [x] will now be described. Since the capacity value is 16 megabits and the total number of sub-word lines SWL is $2^{15}$, the total number of memory cells connected to one sub-word line SWL is $2^{24}$ (i.e., 16 megabits)÷$2^{15}$=$2^9$. That is, the column addresses COL [x] are set for performing control of access to the $2^9$ memory cells with a bus width of ×16 or ×32.

In the case of a bus width of ×32, as 32 is $2^5$, column addresses COL [4] to [0] of high-ordered five bits from the least significant bit may be made unnecessary to identify (i.e., "Don't care") and selection is made on the basis of column addresses COL [8] to [5]. In the case of a bus width of ×16, as 16 is $2^4$, column addresses COL [3] to [0] of high-ordered four bits from the least significant bit may be made unnecessary to identify (i.e., "Don't care") and selection is made on the basis of column addresses COL [8] to [4].

Since the addresses A [x] allocated to the column addresses COL [8] to [5] or COL [8] to [4] are directly related to an access operation to the memory cells and must be sequentially switched, similarly to the selection of each main word line MWL, the low-ordered bits subsequent to the low-ordered bits used for the selection of the main word line MWL must be used. Therefore, addresses A [12] to [9] or A [13] to [9] are allocated.

A second embodiment shown in FIG. 6 is an exemplary structure of a BIST circuit 20 having a function to select, in BIST, a bus width for input/output data designated by memory operation specification information inputted from the outside and stored therein, from a plurality of data signal paths arranged in advance at the time of designing between the BIST circuit 20 and a memory main circuit 100.

In the second embodiment, prior to BIST, one-bit structured bus width information R2 is inputted from the outside as memory operation specification information. Specification information designated by the one-bit bus width information R2 is a bus width of ×16 (R2="0") or a bus width of ×32 (R2="1"), similarly to the first embodiment. The inputted information R2 is stored into a bus-width-information storing circuit 2, which is a one-bit register. The bus width information R2 stored in the storing circuit 2 is inputted to a write data selector circuit 22 and a read data selector circuit 23.

The write data selector circuit 22 receives 32-bit write data DI [31:0] generated at a data generator circuit 21, then selects all the write data DI [31:0] or data of low-ordered 15 bits thereof in accordance with the bus width information R2, and outputs the selected data as selective write data SDI [31:0] to the memory main circuit 100.

A truth table of the selective write data SDI [31:0] with the bus widths of ×16 and ×32, selected in accordance with the bud width information R2, is shown in FIG. 7. In the case of the bus width of ×32, the write data DI [31:0] outputted from the data generator circuit 21 is selected as it is as the selective write data SDI [31:0]. In the case of the bus width of ×16, low-ordered 16 bits (DI [15:0]) of the write data DI [31:0] are selected as the selective write data SDI [31:0]. In this case, provision of "0" data is set for the data signal paths of the non-selective high-ordered 16 bits arranged between the BIST circuit 20 and the memory main circuit 100. The voltage level of the data signal paths of the non-selective high-ordered 16 bits will not be undefined and erroneous operations can be prevented. These settings must be selected prior to a write operation to the memory main circuit 100 synchronous with a clock signal CLK.

The voltage fixing of the data signal paths of the non-selective 16 bits is not limited to "0" data. As long as the voltage level is fixed, "1" data or other voltage levels can be used, as a matter of course. It is preferred that the voltage level signals provided for the non-selective data signal paths are not written to the memory cells.

The read data selector circuit 23 receives read data DO [31:0] read out from the memory main circuit 100 and high-order expected values DE [31:16] of high-ordered 16 bits of 32-bit data generated by the data generator circuit 21, then selects either data in accordance with the bus width information R2, and outputs the selected data as selective read data SDO [31:16] to read data judgment circuit 24.

A truth table of the selective read data SDO [31:16] when selecting the bus width of ×16 or ×32 in accordance with the bus width information R2 is shown in FIG. 8. In the case of the bus width of ×16, the high-order expected values DE [31:16] outputted from the data generator circuit 21 is selected as the selective read data SDO [31:16]. Thus, the read data judgment circuit 24 compares and judges the same data in the non-selective high-ordered 16 bits, and the result of judgment on the non-selective parts shows coincidence. In the case of the bus width of ×32, high-ordered 16 bits (DO [31:16]) of the read data DO [31:0] are selected as the selective read data SDO [31:16].

In the case where the read data judgment circuit 24 is constituted to receive the bus width information R2, the read data selector circuit 23 may be inactivated in the case of the bus width of ×16. This is because the high-order expected values DE [31:16] need not be outputted to the read data judgment circuit 24 on the following stage in the inactive state in order to obtain the result of judgment showing coincidence. The output data signal paths of the inactivated read data selector circuit 23 may be constituted with their voltage levels fixed by "0" data or the like, similarly to the data signal paths of the high-ordered 16 bits of the write data selector circuit 22 in the case of the bus width of ×16.

The read data judgment circuit 24 accepts low-ordered read data DO [15:0] outputted from the memory main circuit 100, as data in the case of the bus width of ×16, and also accepts the low-ordered read data DO [15:0] together with the selective read data SDO [31:16], as data in the case of the bus width of ×32. As expected values in judgment, the read data judgment circuit 24 accepts low-order expected values DE [15:0] from the data generator circuit 21 in the case of the bus width of ×16, and also accepts the low-order expected values DE [15:0] together with the high-order expected values DE [31:16] in the case of the bus width of ×32. Thus, the result of judgment JG is outputted.

The read data judgment circuit 24 can also be constituted to accept the bus width information R2. In this case, activation control of the judgment circuit 24 for each bit to be judged is carried out in accordance with the bus width information R2. Specifically, in the case of the bus width of ×32, all the judgment circuits are activated, whereas in the case of the bus width of ×16, judgment circuits corresponding to the high-ordered 16 bits are inactivated. Thus, the power consumption in the read data judgment circuit 24 can be reduced.

Figure 9:
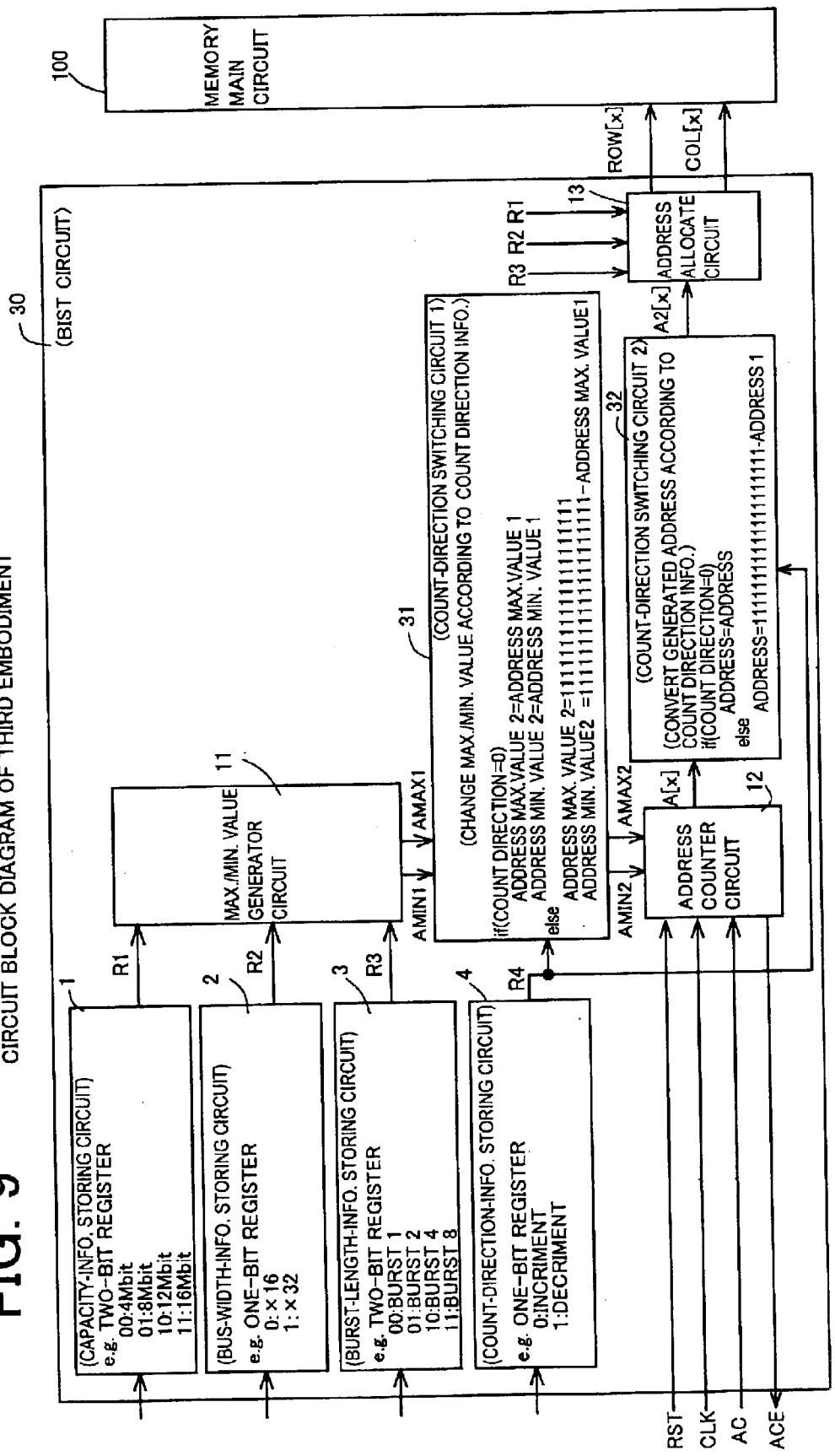
FIG. 9 is a circuit block diagram of a third embodiment.

A third embodiment shown in FIG. 9 is an exemplary structure of a BIST circuit 30 having a function to switch, in BIST, the direction of transition of sequentially changed addresses in accordance with test specification information inputted from the outside and stored therein.

The third embodiment includes the following constituent elements, in addition to the BIST circuit 10 of the first embodiment: a count-direction-information storing circuit 4, which is a one-bit register to which one-bit structured count direction information R4 is inputted from the outside as test specification information; a count-direction switching circuit 1 (31) for receiving a maximum address AMAX1 and a minimum address AMIN1 set by a max./min. value generator circuit 11 and outputting a maximum address AMAX2 and a minimum address AMIM2 to an address counter circuit 12; and an count-direction switching circuit 2 (32) for receiving an address A [x] from the address counter circuit 12 and outputting an address A2[x] to an address allocater circuit 13.

Test specification information designated by the one-bit count direction information R4 is, for example, increment designation (R4="0") for designating count-up or decrement designation (R4="1") for designating count-down.

As the count-direction switching circuit 1 (31) performs control on the maximum address AMAX1 and the minimum address AMIN1 and the count-direction switching circuit 2 (32) performs controls on the address A[x], an address count operation having two count directions of count-up and count-down for the address A2 [x] is realized by using the address counter circuit 12 which carries out a count-up operation.

In the case of a count-up operation, the count operation of the address counter circuit 12 may be used as it is. The maximum address AMAX1 and the minimum address AMIN1 outputted from the max./min. value generator circuit 11 are outputted as the maximum address AMAX2 and the minimum address AMIN2, and the address A [x] is outputted as it is as the address A2 [x].

In the case of a count-down operation, the count-direction switching circuit 1 (31) converts the maximum address AMAX2 to a maximum value (MAX0) that can be counted at the address counter circuit 12, and converts the minimum address AMIM2 to a value obtained by subtracting the maximum address AMAX1 from the maximum value (MAX0) that can be counted at the address counter circuit 12. That is, the following equations hold.

$$AMAX2=MAX0, AMIN2=MAX0-AMAX1$$

With respect to the address A [x] counted up under these conditions, the count-direction switching circuit 2 (32) converts a value obtained by subtracting the address A [x] from the maximum value (MAX0) that can be counted at the address counter circuit 12, to the address A2 [x]. That is, the following equation holds.

$$A2[x]=MAX0-A[x]$$

By the foregoing conversion, the address A2 [x] obtained in the count-up operation from the minimum address AMIM2 to the maximum address AMAX2 has the following relation with the minimum address A [x]=AMIM2 from the address counter circuit 12.

$$A2[x]=MAX0-A[x]=MAX0-(MAX0-AMAX1)=AMAX1$$

The address A2 [x] also has the following relation with the maximum address A [x]=AMAX2 from the address counter circuit 12.

$$A2[x]=MAX0-A[x]=MAX0-(MAX0)=0$$

While the count-up operation is carried out at the address counter circuit 12, the count direction of the address A2 [x] supplied to the memory main circuit 100 is reversed to the count-down direction.

Figure 10:
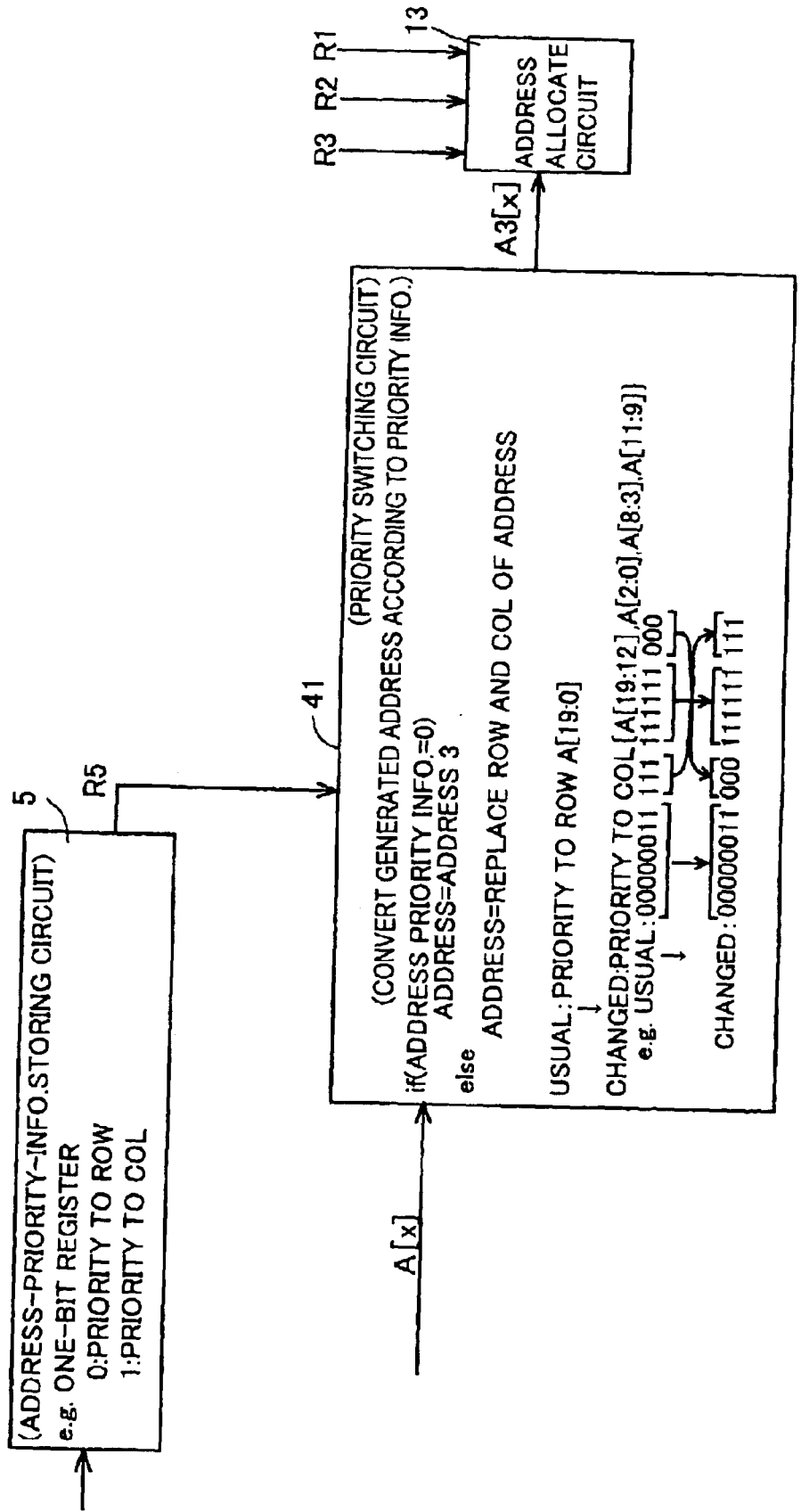
FIG. 10 is a circuit block diagram showing main part of a fourth embodiment.

A fourth embodiment shown in FIG. 10 is an exemplary structure of a BIST circuit having a function to switch, in BIST, the bit structure of sequentially shifted address count in accordance with test specification information inputted from the outside and stored therein. In FIG. 10, essential parts of the BIST circuit are shown.

The fourth embodiment has an address priority information storing circuit 5, which is a one-bit register to which one-bit structured address priority information R5 is inputted from the outside as test specification information, and a priority switching circuit 41. The priority switching circuit 41 performs switching control of the bit position of an address A [x] inputted thereto in accordance with the address priority information R5 and outputs the result as an address A3 [x]. The address A3 [x] is allocated as row addresses and column addresses by an address allocater circuit 13. The address allocater circuit 13 allocates low-ordered bits of the address A3 [x] to row addresses.

Test specification information designated by the one-bit address priority information R5 is, for example, designation of priority of row addresses (R5="0") or designation of priority of column addresses (R5="1").

In the case of the designation of priority of row addresses, the priority switching circuit 41 does not switch the bit position of the address A [x]. Since the low-ordered bits counted at an address counter circuit or the like are allocated to row addresses, preferential transition of the row addresses can be set.

In the case of the designation of priority of column addresses, the priority switching circuit 41 switches the bit position of the address A [x]. For example, with respect to an address A [19:0] of 20 bits, switching of the bit positions such as A3 [x]={A [19:12], A [2:0], A [8:3], A [11:9]} (Verilog description) is carried out. Verilog is the name of a logical simulator using a functional description language, and the foregoing Verilog description shows the following switching of the bit positions.

A3 [19]=A [19], A3 [18]=A [18], A3 [17]=A [17], A3 [16]=A [16], A3 [15]=A [15], A3 [14]=A [14], A3 [13]=A [13], A3 [12]=A [12], A3 [11]=A [2], A3 [10]=A [1], A3 [9]=A [0], A3 [8]=A [8], A3 [7]=A [7], A3 [6]=A [6], A3 [5]=A [5], A3 [4]=A [4], A3 [3]=A[3], A3 [2]=A [11], A3 [1]=A [10], A3 [0]=A [9].

Since the address allocater circuit 13 allocates the low-ordered bits of the address A3 [x] to the row address, the column address in accordance with the address allocation of FIGS. 4 and 5 has five bits of {A [13:12], A [2:0]} in the case of the bus width of ×16 and four bits of {A [12], A [2:0]} in the case of the bus width of ×32. The column address is constituted to include the least significant bit in the address count and preferential transition of the column address can be set.

Figure 11:
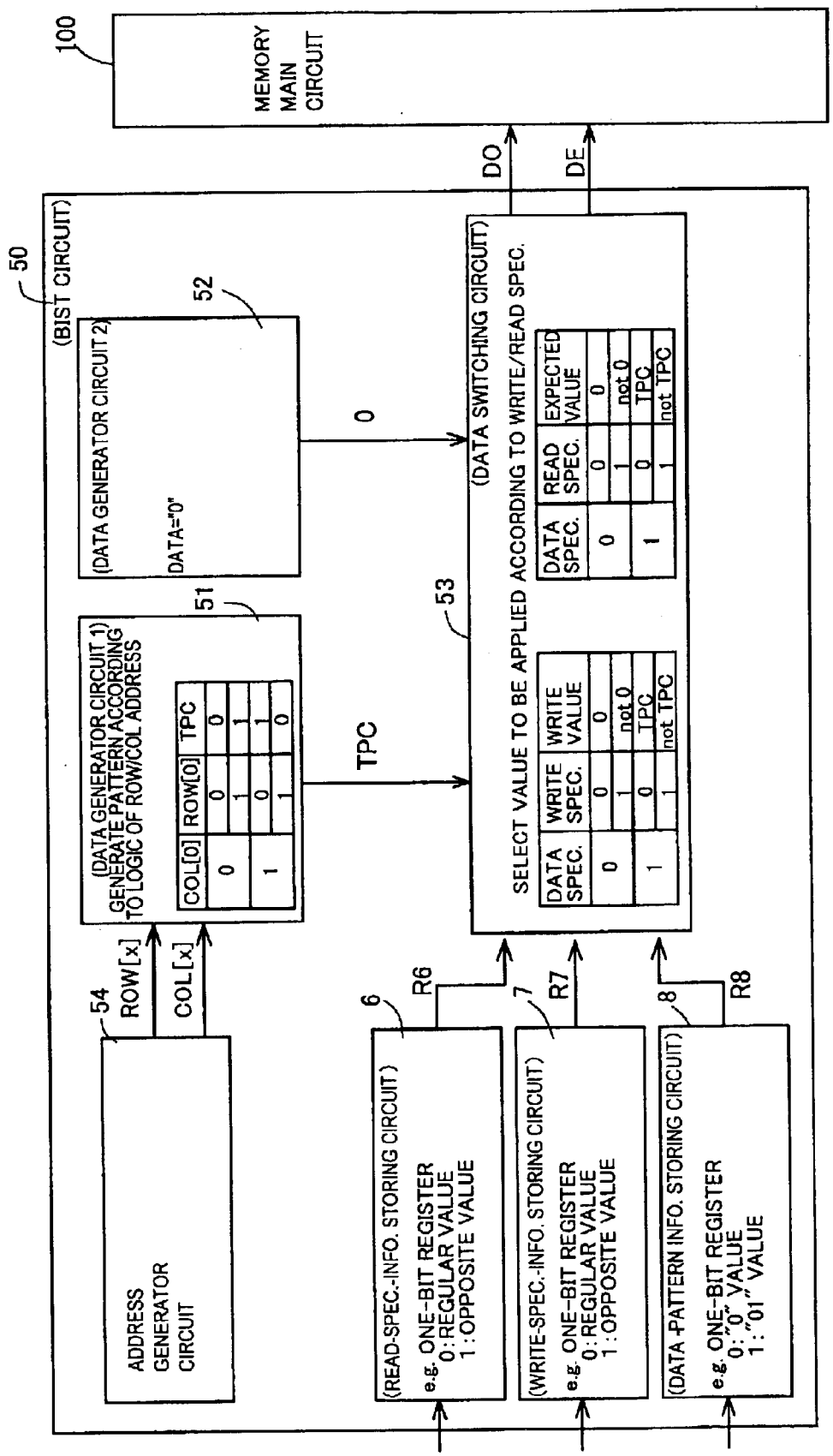
FIG. 11 is a circuit block diagram of a fifth embodiment.

A fifth embodiment shown in FIG. 11 is an exemplary structure of a BIST circuit 50 having a function to adjust data pattern in BIST in accordance with test specification information inputted from the outside and stored therein.

In the fifth embodiment, prior to BIST, as test specification information, one-bit structured read specification information R6 and write specification information R7, and one-bit structured data pattern information R8 are stored from the outside to a read-specification-information storing circuit 6, a write-specification-information storing circuit 7, and a data-pattern-information storing circuit 8, which are a one-bit register, respectively. The one-bit read specification information R6 and write specification information R7 are constituted as logical information. For example, these include information of regular value of the logical level of data (R6, R7="0") and opposite value of the logical level of data (R6, R7="1"). The one-bit data pattern information R8 includes information of data pattern selection, for example, selection of a "0"-value data pattern (R8="0") and selection of a "01"-value data pattern (R8="1").

A data generator circuit 1 (51) and a data generator circuit 2 (52) are provided corresponding to the data pattern information R8. The data generator circuit 1 (51) receives a row/column address ROW [x]/COL [x] from an address generator circuit 54 and generates a "01"-value data pattern. A "0"-value is generated by calculating exclusive-OR of the row/column address ROW [0]/COL [0] of the least significant bit. Specifically, a "0"-value is allocated to a memory cell having an address with its logical level coincident with the row address ROW [0] and the column address COL [0], and a "1"-value is allocated to a memory cell having an address with its logical level not coincident with the row address ROW [0] and the column address [0]. A data pattern such that a "0"-value and a "1"-value are switched between adjacent addresses is generated. The data generator circuit 2 (52) generates "0"-value data.

Although only the data generator circuits 1 (51) and 2 (52) are described in FIG. 11, it is a matter of course that other data generator circuits may be freely added. In this case, the number of constituent bits of the data pattern information R8 must be increased in accordance with the type of data generator circuit. A third data generator circuit, for example, can be constituted to generate a value "0011" as data. The circuit structure in this case can generate the value by calculating exclusive-OR of the row/column address ROW [1]/COL [1] of a bit immediately above the least significant bit.

A data switching circuit 53, to which the data logical information R6, R7 and the data pattern information R8 are inputted, selects one of the data generator circuits 1 (51) and 2 (52) in accordance with the data pattern information R8 and selects the corresponding data pattern. For the selected data pattern, whether to perform logical opposite value is switched in accordance with the data logical information R6, R7,. In FIG. 11, a data pattern DO in writing and an expected value pattern DE in reading can be independently selected.

With respect to the data pattern DO and the expected value pattern DE, similar data switching is carried out. Therefore, switching of the data pattern DO will be described here. In the case of the data pattern information R8=0, a "0"-value is selected as a data pattern. If regular value is designated by the write specification information R7=0, DO="0" is supplied to a memory main circuit 100 as a data pattern. If opposite value is designated by R7=1, DO=not "0"="1" is supplied to the memory main circuit 100 as a data pattern. In the case of R8=1, a "01"-value is selected as a data pattern. If regular value is designated by R7=0, DO="01" is supplied to the memory main circuit 100 as a data pattern. If opposite value is designated by R7=1, DO=not "01"="10" is supplied to the memory main circuit 100 as a data pattern.

In the fifth embodiment, the BIST circuit 50 has a set of circuit structures and data switching is applied commonly to all the buses. However, the circuit structure of FIG. 11 can be provided for a predetermined number of buses each. Thus, BIST using a proper combination of data patterns can be carried out for a predetermined number of buses each.

Figure 12:
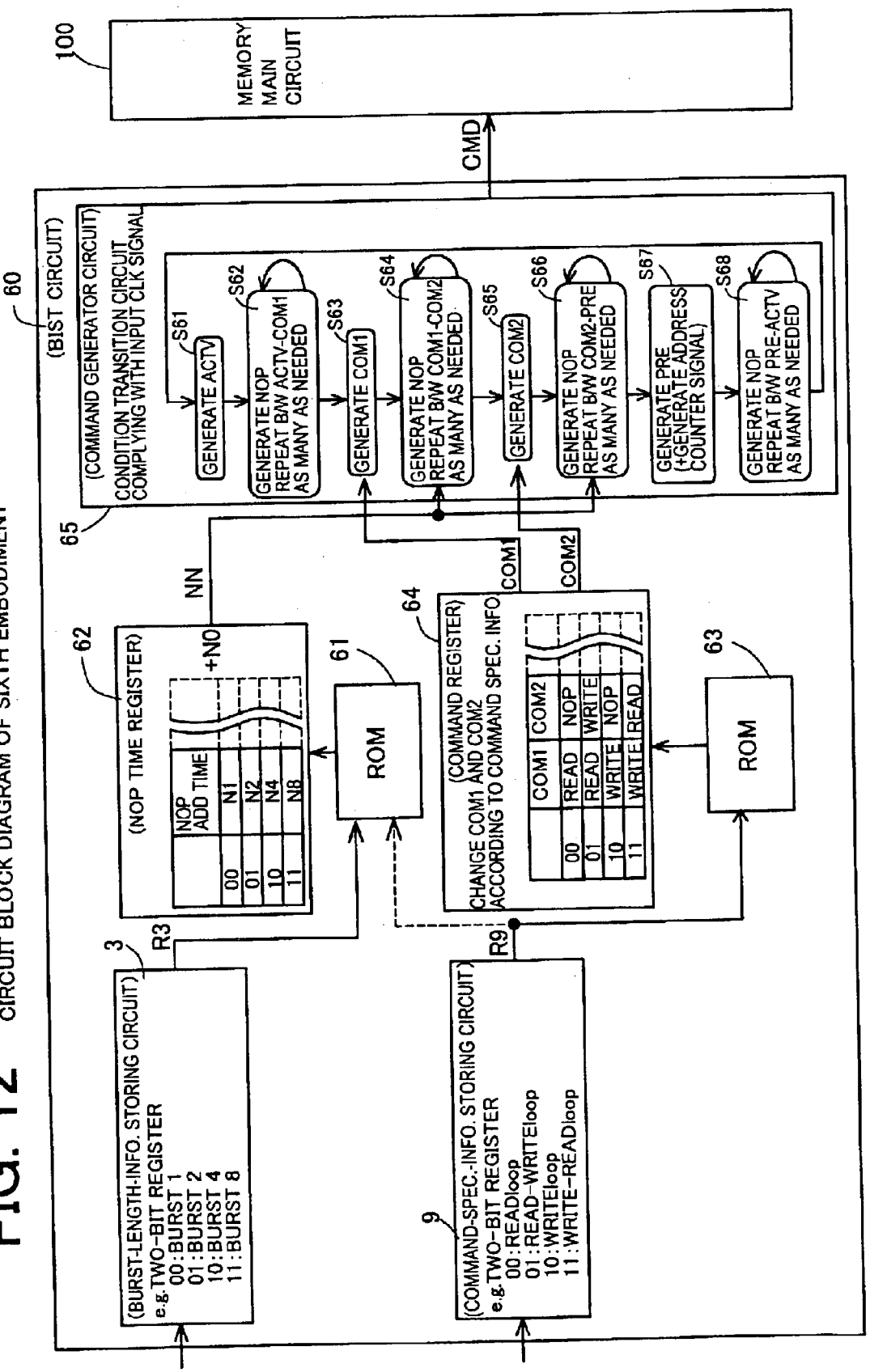
FIG. 12 is a circuit block diagram of a sixth embodiment.

A sixth embodiment shown in FIG. 12 is an exemplary structure of a BIST circuit 60 having a function to adjust a command pattern in BIST in accordance with test specification information inputted from the outside and stored therein.

In the sixth embodiment, prior to BIST, as test specification information, two-bit structured burst length information R3 and two-bit structured command specification information R9 are stored from the outside to a burst-length-information storing circuit 3 and a command-specification-information storing circuit 9, which are two-bit registers, respectively. The two-bit command specification information R9 has, for example, information of the case of carrying out a read operation (R9="00"), the case of carrying out a write operation after a read operation (R9="01"), the case of carrying out a write operation (R9="10"), and the case of carrying out a read operation after a write operation (R9="11"). The burst length information R3 is constituted similarly to the first embodiment.

BIST is carried out as a command pattern from a command generator circuit 65 in which a predetermined command sequence is set is supplied to a memory main circuit 100. At predetermined timing of the command sequence set in the command generator circuit 65, command regions COM1, COM2 are provided in which predetermined commands are set in accordance with the command specification information R9. An NOP command is set to be generated continuously for a predetermined number of times following the command regions COM1, COM2. Since the number of times of generation differs depending on the burst length, a predetermined number of times of NOP command generation is set in accordance with the burst length information R3.

First, the setting of commands in the command regions COM1, COM2 will be described. In a ROM 63, information of various commands that can be used in the sixth embodiment is stored for each command. The form of the information stored in the ROM 63 is, for example, logical information of various control signals for causing the memory main circuit 100 to carry out circuit operations corresponding to commands. The control signals in this case are a RAS signal, a CS signal, a WE signal and the like.

In a command register 64, various commands loaded from the ROM 63 are stored in the form of logical information of control signals for each of the command regions COM1, COM2 in accordance with the contents of the command specification information R9. In the case of R9="00", a READ command and an NOP command are stored as commands for the command regions COM1, COM2, respectively. In the case of R9="01", a READ command and a WRITE command are stored as commands for the command regions COM1, COM2, respectively. In the case of R9="10", a WRITE command and an NOP command are stored as commands for the command regions COM1, COM2, respectively. In the case of R9="11", a WRITE command and a READ command are stored as commands for the command regions COM1, COM2, respectively.

The setting of the number of times of continuous generation of an NOP command following the command regions COM1, COM2 is similarly carried out. In a ROM 61, the numbers of times of NOP addition N1, N2, N4 and N8 for the respective burst lengths are stored. The number of times of NOP addition is the number of times obtained by subtracting the number of times of NOP required by the characteristics proper to the memory main circuit 100 from the number of times of NOP necessary for continuous accesses in a burst operation. The proper characteristics are the number of times of NOP to be inserted on the basis of an access speed determined by circuit and device elements, and so on. The form of the information stored in the ROM 61 is information obtained by expanding, by the number of times, logical information of various controls signals for causing the memory main circuit 100 to carry out NOP operations, similarly to the case of the ROM 63.

In a number-of-NOP-times register 62, the number of times of NOP is loaded from the ROM 61 in accordance with the contents of the burst length information R3, . In FIG. 12, the number-of-NOP-times register 62 is constituted on the assumption that the number of times of NOP addition is set in accordance with the burst length irrespective of the commands set in the command regions COM1, COM2. However, by separately providing information of the number of times of NOP addition stored in the ROM 61 for each command, the number of times of NOP can be set in accordance with the burst length for each command. In this case, selection of the number of times of NOP addition from the ROM 61 is carried out in accordance with the command specification information R9 as well as the burst length information R3.

The command sequence of the command generator circuit 65 starts with generation of an ACTV command (S61), then goes through an NOP command loop (S62) set by the operation characteristics of the memory main circuit 100, and proceeds to reception of a corresponding command in the command region COM1 from the command register 64 (S63). After that, NOP commands of the corresponding number of times are received from the number-of-NOP-times register 62, thus executing the NOP command loop (S64). Subsequently, after similar operations are repeated in the command region COM2 and the NOP command loop (S65, S66), a PRE command is generated and an address count signal for the next access is generated to shift the count value (S67). After the operation timing is adjusted by the NOP command loop (S68), the sequence returns to S61.

Figure 13:
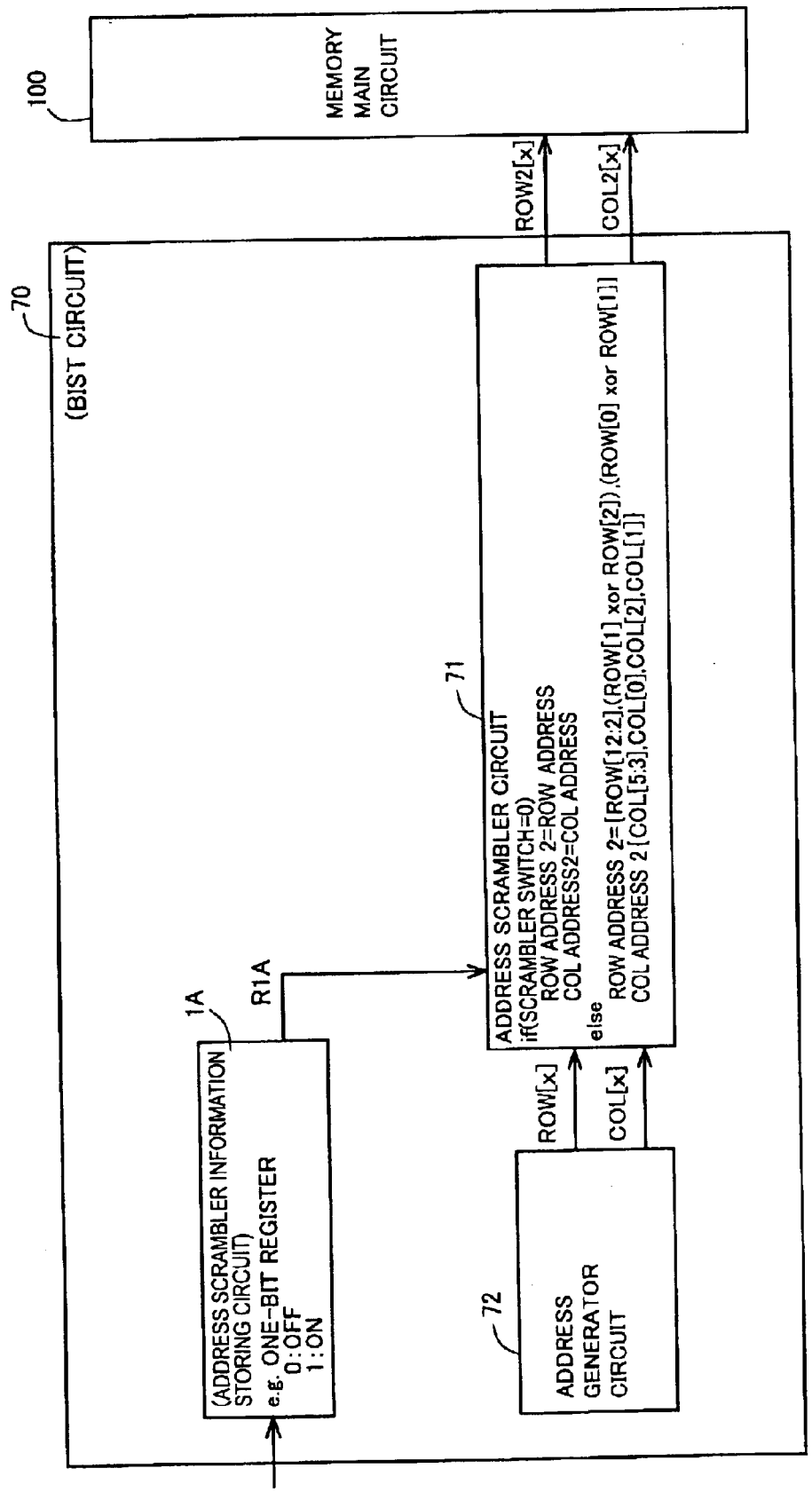
FIG. 13 is a circuit block diagram of a seventh embodiment.

A seventh embodiment shown in FIG. 13 is an exemplary structure of a BIST circuit 70 having a function to adjust the presence/absence of an address scrambler in BIST in accordance with test specification information inputted from the outside and stored therein.

In the seventh embodiment, prior to BIST, one-bit structured address scrambler information R1A is inputted from the outside as test specification information and stored to an address scrambler information storing circuit 1A, which is a one-bit register. The address scrambler information R1A is, for example, information that the scrambler function is off (R1A="0") and that the scrambler function is on (R1A="1").

An address scrambler circuit 71 receives a row/column address ROW [x]/COL [x] outputted from an address generator circuit 72, and controlled by the address scrambler information R1 A, the address scrambler circuit 71 supplies a row/column address ROW2 [x]/COL2 [x] for switching on/off the address scrambler, to a memory main circuit 100.

When the scrambler function is off, the inputted row/column address ROW [x]/COL [x] is outputted as it is, as the row/column address ROW2 [x]/COL2 [x]. The row/column address ROW [x]/COL [x] and the row/column address ROW2 [x]/COL2 [x] are directly connected with each other without using the address scrambler circuit 71.

When the scrambler function is on, logical operations such as calculation of exclusive-OR between scrambler target bits and switching of bit positions are carried out with respect to the inputted row/column address ROW [x]/COL [x], and scrambling is carried out in accordance with the structure of a memory-cell array region. For example, with respect to the row address ROW2 [x], the following scrambling is carried out.

ROW2 [x]={ROW [12:2], (ROW [1] xor ROW [2]), (ROW [0] xor ROW [1])} (Verilog description)

The addresses of low-ordered two bits are scrambled in accordance with the addresses of low-ordered three bits. With respect to the column address COL2 [x], the following scrambling is carried out.

COL2 [x]={COL [5:3], COL [0], COL [2], COL [1]} (Verilog description)

The bit positions of the addresses of low-ordered three bits are switched to scramble the address.

The address scrambler must be set in accordance with the arrangement structure of the memory-cell array region, and as a matter of course, conversion not limited to the foregoing exemplary conversion but corresponding to the arrangement structure is carried out.

Figure 14:
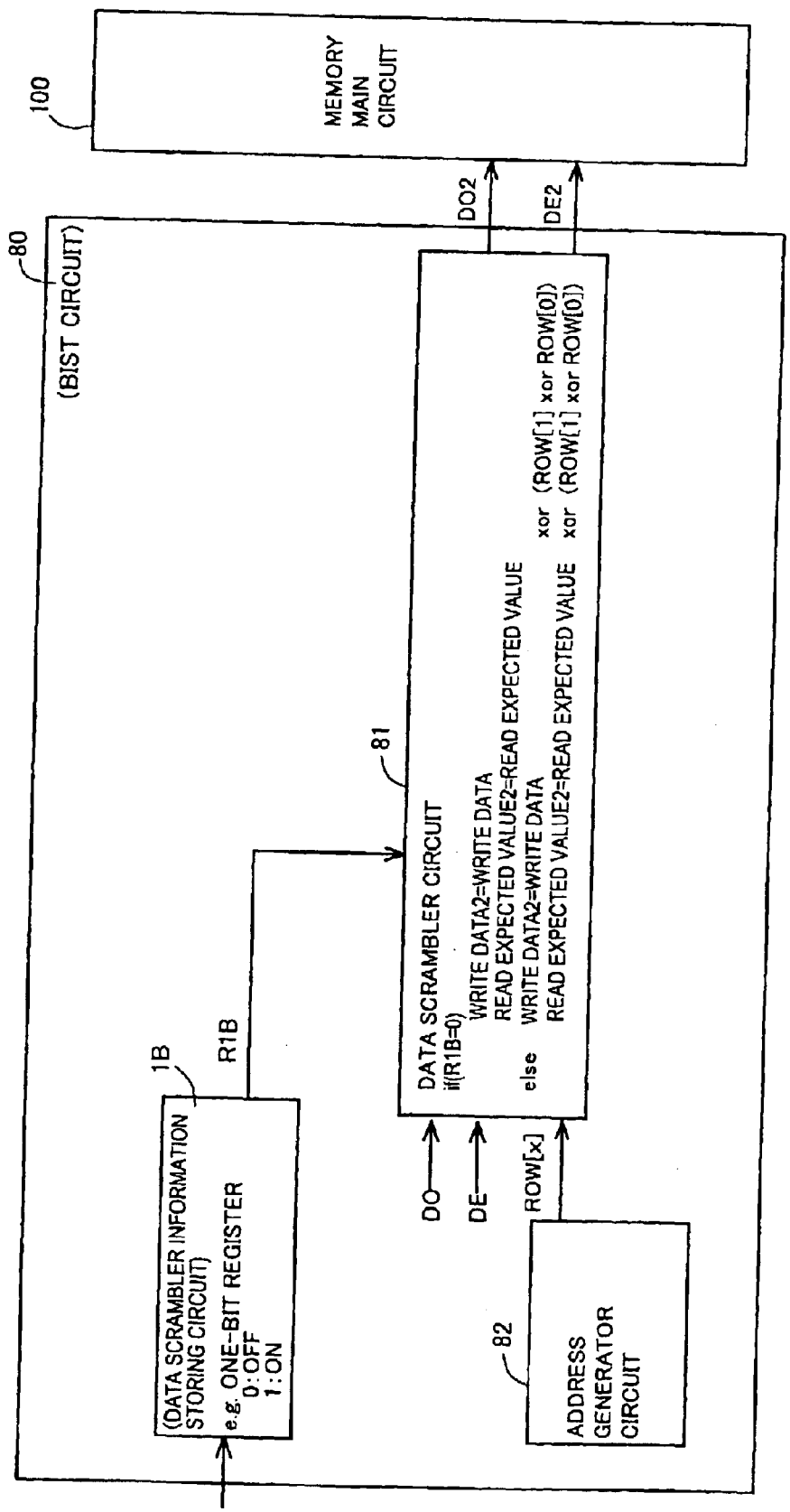
FIG. 14 is a circuit block diagram of an eighth embodiment.

An eighth embodiment shown in FIG. 14 is an exemplary structure of a BIST circuit 80 having a function to adjust the presence/absence of a data scrambler in BIST in accordance with test specification information inputted from the outside and stored therein.

In the eighth embodiment, prior to BIST, one-bit structured data scrambler information R1 B is inputted from the outside as test specification information and stored to a data scrambler information storing circuit 1B, which is a one-bit register. The data scrambler information R1B is, for example, information that the data scrambler function is off (R1B="0") and that the data scrambler function is on (R1B="1").

A data scrambler circuit 81 accepts data DO and an expected value DE and also receives a row address ROW [x] outputted from an address generator circuit 82. Under the control of the data scrambler information R1B, the data scrambler circuit 81 supplies data DO2 and an expected value DE2 for switching on/off the data scrambler, to a memory main circuit 100.

When the data scrambler function is off, the inputted data DO and expected value DE are outputted as the data DO2 and expected value DE2. The data DO and expected value DE, and the data DO2 and expected value DE2 are directly connected with each other without using the data scrambler circuit 81.

When the data scrambler function is on, the inputted data DO and expected value DE are converted by row addresses ROW [0], [1]. For example, with respect to each of the data DO2 and expected value DE2, the following scrambling is carried out.

DO2=DO xor (ROW [1] xor ROW [0])

DE2=DE xor (ROW [1] xor ROW [0])

The data DO and expected value DE are scrambled in accordance with the row addresses ROW [1], [0] of low-ordered two bits. With respect to the addresses having logical levels that are not coincident with the logical levels of the row addresses ROW [1], [0] of the low-ordered two bits, the data DO and expected value DE are inverted.

The address scrambler must be set in accordance with the arrangement structure of a memory-cell array region, and as a matter of course, conversion not limited to the foregoing exemplary conversion but corresponding to the arrangement structure is carried out.

Figure 15:
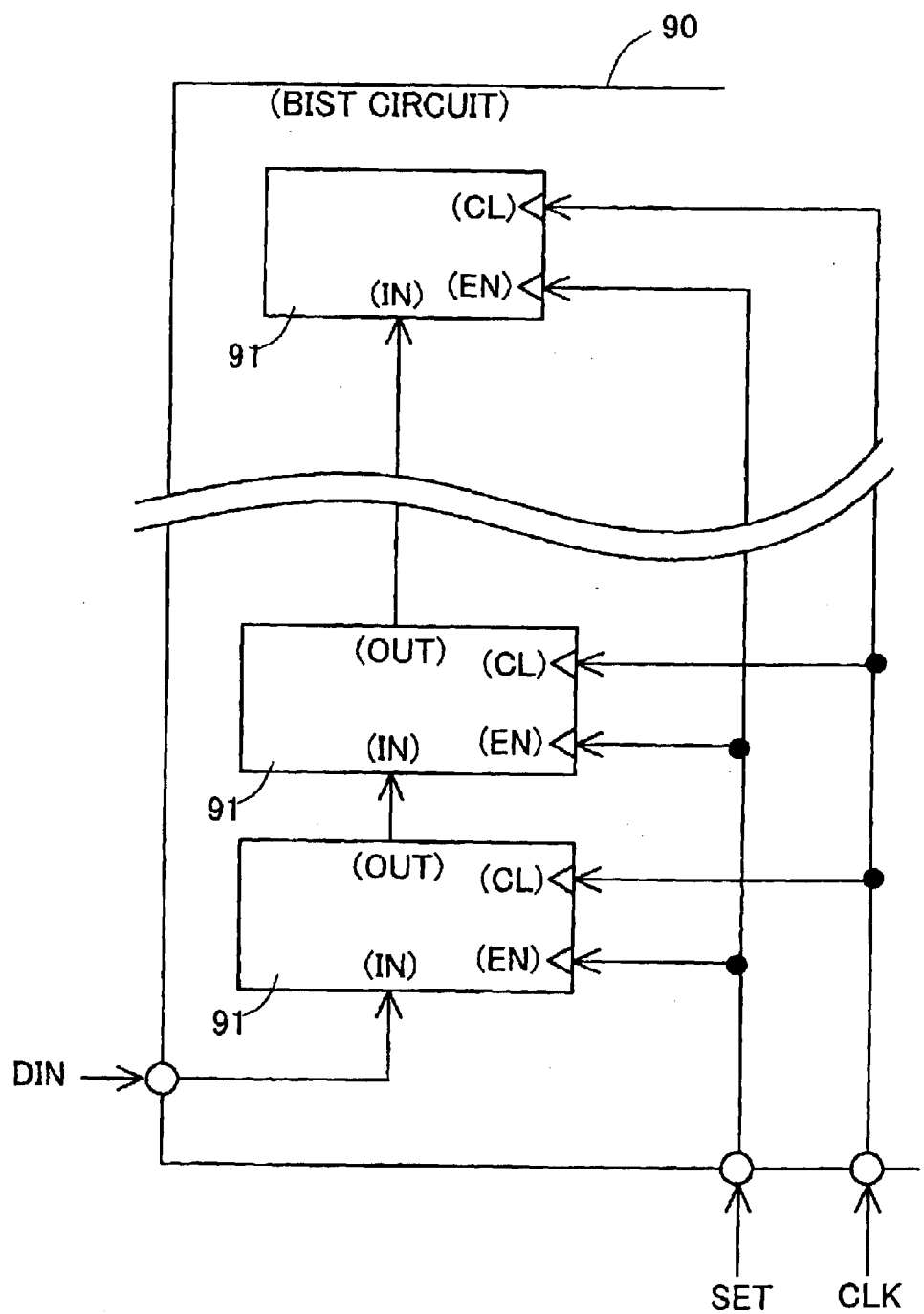
FIG. 15 is a circuit block diagram showing main part of a ninth embodiment.
Figure 16:
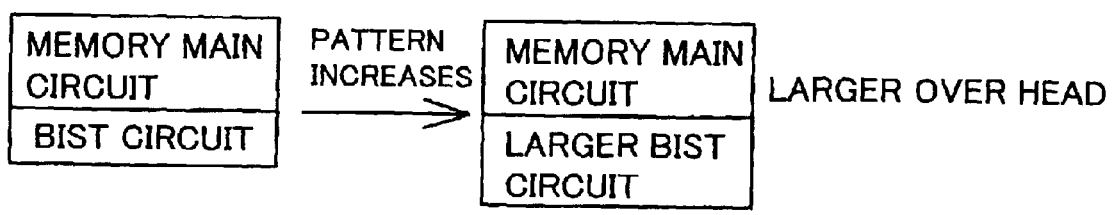
Figure 17:
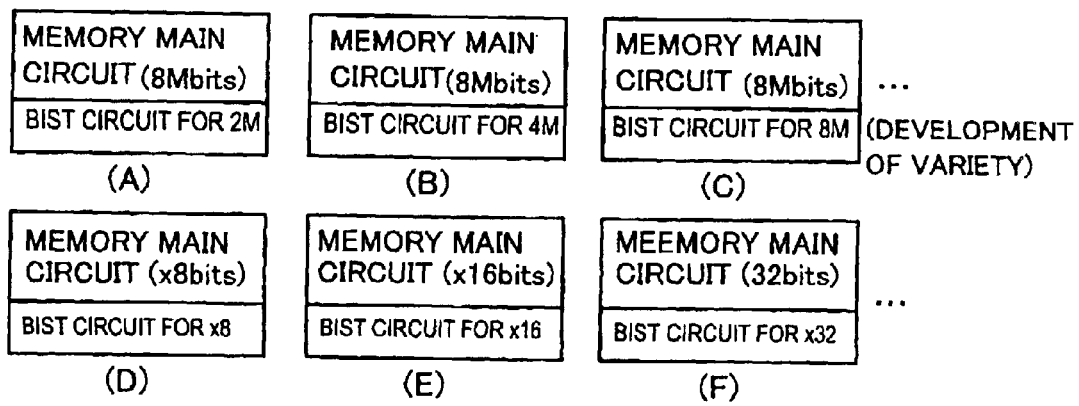
Figure 18:
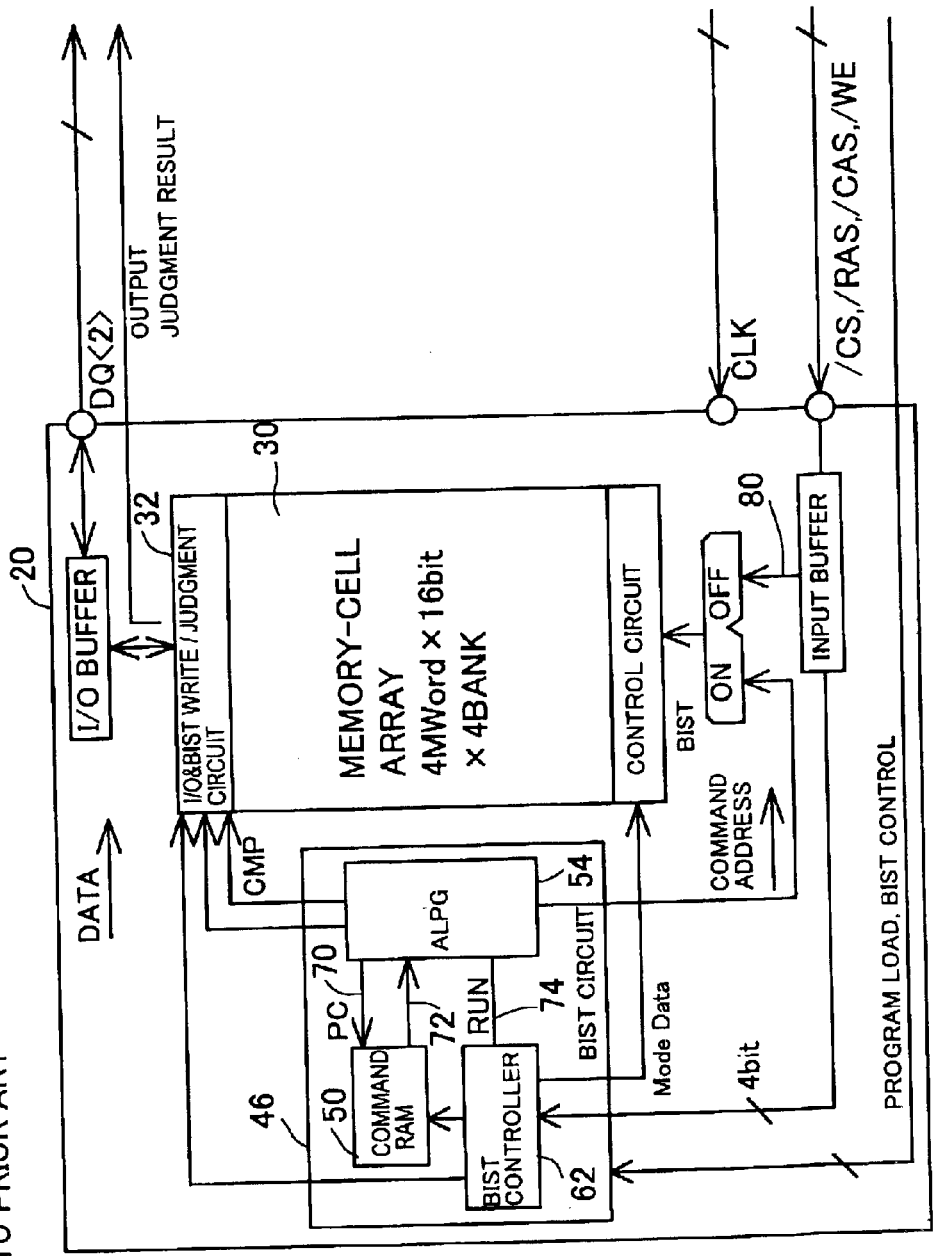
FIG. 18 is a circuit block of a conventional semiconductor memory device with a BIST circuit is built therein.

A ninth embodiment shown in FIG. 15 is an exemplary structure of a BIST circuit 90 which inputs various memory operation specification information and test specification information to respective storing circuits with a simple structure in BIST.

Instead of providing dedicated terminals for inputting information to respective storing circuits 91, the storing circuits 91 are cascaded by activating an information storing signal SET, thus constituting a structure equivalent to a shift register. By sequentially inputting information from an information input terminal DIN synchronously with a clock signal CLK, the information is shifted and inputted over the storing circuits 91. As the three terminals for the information storing signal SET, the clock signal CLK and the information input terminal DIN are provided, various information can be inputted irrespective of the number of storing circuits 91. Information can be inputted with a compact circuit structure.

As described above in detail, in the semiconductor memory device according to the first embodiment, since memory operation specification information such as capacity information R1, bus width information R2 and burst length information R3 is rewritten from the outside, the maximum address AMAX1 and the minimum address AMIN1 in an address space matching the memory capacity, bus width and burst length can be set. Flexible adjustment can be made even in the case of memory specifications which differ depending on the type.

In the semiconductor memory device according to the second embodiment, since bus width information R2 as memory operation specification information is rewritten from the outside, selective write data SDI [31:0] and selective read data SDO [31:16], which are data paths matching a necessary bus width for input/output data, can be selected from a plurality of signal paths arranged in advance between the BIST circuit 20 and the memory main circuit 100. Flexible adjustment can be made even in the case of a bus width which differs depending on the type.

In the semiconductor memory device according to the third embodiment, since count direction information R4 as test specification information is rewritten from the outside, BIST can be carried out in both count-up and count-down directions. Operation characteristics based on the circuit operations of the address decoder and the like due to the difference in address count direction can be tested.

In the semiconductor memory device according to the fourth embodiment, since address priority information R5 as test specification information is rewritten from the outside, the priority of address transition in BIST can be property changed. Operation characteristics based on the difference in circuit operation due to the difference in address transition can be tested.

In the semiconductor memory device according to the fifth embodiment, since test specification information such as read specification information R6, write specification information R7 and data pattern information R8 is rewritten from the outside, BIST can be carried out while selecting an appropriate data pattern. Flexible adjustment can be made to difference types and test specifications.

In the semiconductor memory device according to the sixth embodiment, since burst length information R3 as memory operation specification information and command specification information R9 as test specification information are rewritten from the outside, BIST can be carried out while changing a command pattern.

In the semiconductor memory device according to the seventh embodiment, since address scrambler information R1A as test specification information is rewritten from the outside, BIST can be carried out while switching the presence/absence of the address scrambler.

In the semiconductor memory device according to the eighth embodiment, since data scrambler information R1B as test specification information is rewritten from the outside, BIST can be carried out while switching the presence/absence of the data scrambler.

In the semiconductor memory device according to the ninth embodiment, rewriting of various information can be carried out to many storing circuits 91 with a small number of terminals.

It is to be noted that the present invention is not limited to the above-described embodiments and that various improvements and modifications can be made without departing from the scope of the present invention.

For example, though the count direction of the address counter circuit 12 is fixed to an increment direction in the first embodiment, the present invention is not limited to this and an address counter circuit constituted to switch the count direction between an increment direction and a decrement direction can be provided.

Moreover, though it is assumed that the minimum address AMIN1 at the max./min. value generator circuit 11 is "0", an address which is not "0" can be set as the minimum address.

In the second embodiment, the data generator circuit 21 generates 32-bit write data DI [31:0]. However, switching between data having a 32-bit bus width and data having a 16-bit bus width can be carried out in accordance with bus width information. Thus, data matching the bus width can be generated and the operating current of the data generator circuit can be reduced.

In the third embodiment, a counter circuit capable of carrying out bidirectional count operations can be provided instead of the address counter circuit 12.

In the sixth embodiment, a plurality of types of command generator circuits can be provided and selectively used by switching in accordance with command specification information R9. In this case, the command specification information R9 must be constituted with a bit width that enables combination of commands in accordance with a command pattern. Accordingly, the command-specification-information storing circuit 9 and the register structure of the command register need to have corresponding bit structures.

Moreover, the number of times of NOP can be switched by command. In this case, the number-of-NOP-times register may be set separately for each command.

In the embodiments, the functions to be realized are individually described as a matter of convenience. However, the functions can be suitably combined.

With respect to the information R1 to R1B, more detailed conditions or less detailed conditions can be set for each information, and adjustment can be made by increasing or decreasing the number of constituent bits in accordance with the number of conditions.

The storing circuits 1 to 1B can be realized by using a circuit having a data holding function such as a register or RAM, or can be constituted by a fixed data setting circuit which allows only one setting such as a fuse or one-time ROM.

Although a synchronous-type semiconductor memory device is described as an example in the embodiments, the present invention is not limited to this. An asynchronous-type semiconductor memory device having a built-in timer or the like can similarly realize the BIST function and the present invention can also be applied to this.

Moreover, the present invention can be applied to a semiconductor memory LSI and can also be applied to a system LSI having a built-in semiconductor memory, which is a memory module, as a functional macro circuit block. The semiconductor memory LSI can be preferably applied to an LSI of high-speed operation and enables testing without providing an expensive memory tester of high-speed operation specifications in memory test. The semiconductor memory LSI can also be preferably applied to a memory module built in a system LSI or the like and enables testing even in the case where direct testing of the memory module from an LSI tester cannot be carried out, for example, because terminals necessary for testing are not taken outward.

According to the present invention, it is possible to provide a semiconductor memory device or a semiconductor device having a semiconductor memory device as a memory macro, the semiconductor memory device having a self-diagnostic test function, the semiconductor memory device comprising a memory operation specification information storing unit in which memory operation that is rewritable from the outside is stored, or a test specification information storing unit in which test specification information that is rewritable from the outside is stored, wherein an operation parameter or operation specifications in self-diagnostic test are set on the basis of each information stored in each storing unit, so that flexible adjustment to change and addition of test specifications can be made without having to perform complicated control with a complicated and large-scale circuit structure.

What is claimed is:

1. A semiconductor memory device having a self-diagnostic test function comprising, a memory operation specification information storing unit in which memory operation specification information that is rewritable from the outside is stored, wherein an operation parameter in self-diagnostic test is set on the basis of the memory operation specification information.

2. A semiconductor memory device as claimed in claim 1, wherein the memory operation specification information is at least one of capacity information of memory cells, bus width information of input/output data, and burst length information in a burst operation, the semiconductor memory device comprising a max./min. value generator unit for setting at least one of a maximum address and a minimum address in an address space in the self-diagnostic test on the basis of the memory operation specification information.

3. A semiconductor memory device as claimed in claim 1, wherein a plurality of signal paths are arranged in advance for input/output of data, and the memory operation specification information is bus width information of input/output data, the semiconductor memory device comprising:

a write data selector circuit for selecting a data path for write data from the plurality of signal paths on the basis of the memory operation specification information; and a read data selector circuit for selecting a data path for read data from the plurality of signal paths on the basis of the memory operation specification information.

4. A semiconductor memory device as claimed in claim 3, wherein the write data selector circuit fixes non-selective signal paths except the data path from the plurality of signal paths, at a predetermined logical level.

5. A semiconductor memory device as claimed in claim 4, wherein writing to memory cells is not carried out with respect to the predetermined logical level of the non-selective signal paths.

6. A semiconductor memory device as claimed in claim 3, comprising a judgment circuit for comparing the read data in the data path selected by the read data selector circuit, with expected value data.

7. A semiconductor memory device as claimed in claim 6, wherein the read data selector circuit outputs a predetermined signal that is judged to be coincident by the judgment circuit, to non-selective signal paths except the data path from the plurality of signal paths.

8. A semiconductor memory device as claimed in claim 6, wherein the judgment circuit inactivates a judgment operation with respect to non-selective signal paths except the data path from the plurality of signal paths on the basis of the memory operation specification information.

9. A semiconductor memory device as claimed in claim 3, comprising data generator circuit in which a bus width of data to be outputted is set on the basis of the memory operation specification information.

10. A semiconductor memory device as claimed in claim 1, wherein the memory operation specification information is burst length information in a burst operation, the semiconductor memory device comprising:
an NOP storing unit for storing, in advance, an NOP control signal corresponding to continuous generation of an NOP command accompanied by the burst operation, in accordance with the burst length;
a number-of-NOP-times register for storing the NOP control signal selected from the NOP storing unit in accordance with the burst length information; and
a command pattern generator unit to which the NOP control signal stored in the number-of-NOP-times register is sequentially transferred at predetermined timing in a command sequence.

11. A semiconductor memory device as claimed in claim 10, wherein the NOP control signal is stored for each command in the NOP storing unit, and
in accordance with a command pattern executed at the command pattern generator unit,
the NOP control signal is stored to the number-of-NOP-times register and sequentially transferred to the command pattern generator unit.

12. A semiconductor memory device as claimed in claim 1, comprising:
an information input terminal to which information with a predetermined bit width is inputted;
the memory operation specification information storing unit or the test specification information storing unit connected to the information input terminal; and
at least one the memory operation specification information storing unit or the test specification information storing unit connected further thereto;
wherein the information with a predetermined bit width inputted to the information input terminal is sequentially transferred to a plurality of the memory operation specification information storing units or the test specification information storing units connected with each other.

13. A semiconductor memory device having a self-diagnostic test function,
the semiconductor memory device comprising a test specification information storing unit in which test specification information that is rewritable from the outside is stored,
wherein operation specification in self-diagnostic test is set on the basis of the test specification information.

14. A semiconductor memory device as claimed in claim 13, wherein the test specification information is count direction information in address count, the semiconductor memory device comprising:
an address counter for increasing and outputting a count value by each count in accordance with a count-up setting based on the count direction information;
a max./min. value switching unit for setting a maximum count value of the address counter at a maximum possible count value of the address counter and setting a minimum count value at a value obtained by subtracting a maximum address in an address space in the self-diagnostic test from the maximum possible count value, in the case of a count-down setting based on the count direction information; and
a count direction switching unit for setting an address in the address space at a value obtained by subtracting a count value from the maximum possible count value, in the case of the count-down setting based on the count direction information.

15. A semiconductor memory device as claimed in claim 13, wherein the test specification information is address priority information for setting an address to be preferentially transitioned, the semiconductor memory device comprising:
an address counter for outputting a count value including all addresses at which the self-diagnostic test is carried out; and
a first priority address switching unit for setting a predetermined number of low-ordered bits in the count value as the address to be preferentially transitioned, in accordance with the address priority information.

16. A semiconductor memory device as claimed in claim 15, wherein the first priority address switching unit selects the address to be preferentially transitioned among a row address, a column address, and a bank address.

17. A semiconductor memory device as claimed in claim 15, comprising:
an address counter for outputting a count value including all addresses at which the self-diagnostic test is carried out; and
a second priority address switching unit for setting a predetermined number of low-ordered bits in the count value as a first priority address of the address to be preferentially transitioned, and setting a predetermined number of mid-ordered bits in the count value except the low-ordered bits as a second priority address of the address to be preferentially transitioned, in accordance with the address priority information.

18. A semiconductor memory device as claimed in claim 17, wherein the second priority address switching unit selects the first and second priority addresses among a row address, a column address, and a bank address.

19. A semiconductor memory device as claimed in claim 13, wherein the test specification information is data pattern information for selecting a data pattern and data logical information for setting a logical level of at least one of write data and a read expected value, the semiconductor memory device comprising:

at least one of data generator units for generating at least one predetermined data pattern; and a data switching unit for selecting one of the data generator units in accordance with the data pattern information and performing forward and inverse control of the logical level of the write data or the read expected value outputted from one of the data generator units in accordance with the data logical information.

20. A semiconductor memory device as claimed in claim 19, wherein the data generator units include a data generator unit for generating the predetermined data pattern by performing forward and inverse control of the logical level of the write data or the read expected value in accordance with address information.

21. A semiconductor memory device as claimed in claim 19, wherein the test specification information storing unit in which the data pattern information and the data logical information are stored and the data switching unit are provided for every predetermined number of bits of input/output data.

22. A semiconductor memory device as claimed in claim 13, wherein the test specification information is command pattern information for selecting a command pattern, the semiconductor memory device comprising:

a command storing unit in which a command control signal corresponding to each command is stored in advance;

a command pattern register for storing the command control signal selected from the command storing unit in accordance with the command pattern information; and a command pattern generator unit to which the command control signal stored in the command pattern register is sequentially transferred at predetermined timing in a command sequence.

23. A semiconductor memory device as claimed in claim 13, wherein the test specification information is address scrambler information for controlling the presence/absence of an address scrambler, the semiconductor memory device comprising an address scrambler unit on which activation control is performed in accordance with the address scrambler information.

24. A semiconductor memory device as claimed in claim 13, wherein the test specification information is data scrambler information for controlling the presence/absence of a data scrambler, the semiconductor memory device comprising a data scrambler unit on which activation control is performed in accordance with the data scrambler information.

25. A semiconductor memory device as claimed in claim 13, comprising:

an information input terminal to which information with a predetermined bit width is inputted;

the memory operation specification information storing unit or the test specification information storing unit connected to the information input terminal; and at least one the memory operation specification information storing unit or the test specification information storing unit connected further thereto;

wherein the information with a predetermined bit width inputted to the information input terminal is sequentially transferred to a plurality of the memory operation specification information storing units or the test specification information storing units connected with each other.

26. A semiconductor device provided with a semiconductor memory device as a memory macro, having a self-diagnostic test function, comprising a memory operation specification information storing unit in which memory operation specification information that is rewritable from the outside is stored, wherein an operation parameter in self-diagnostic test is set on the basis of the memory operation specification information.

27. A semiconductor device provided with a semiconductor memory device as a memory macro, the semiconductor memory device having a self-diagnostic test function, and comprising a test specification information storing unit in which test specification information that is rewritable from the outside is stored, wherein operation specification in self-diagnostic test is set on the basis of the test specification information.

* * * * *